United States Patent [19]
Komatsu

[11] Patent Number: 5,384,569

[45] Date of Patent: Jan. 24, 1995

[54] INTERPOLATION TYPE FLASH ANALOG-TO-DIGITAL CONVERTER

[75] Inventor: Yoshihiro Komatsu, Kanagawa, Japan

[73] Assignee: Sony Corporation, Tokyo, Japan

[21] Appl. No.: 83,970

[22] Filed: Jun. 28, 1993

[30] Foreign Application Priority Data

Jun. 30, 1992 [JP] Japan .................................. 4-195995

[51] Int. Cl.$^6$ .............................................. H03M 1/36
[52] U.S. Cl. ..................... 341/159; 341/156; 327/74
[58] Field of Search ............... 341/133, 155, 156, 158, 341/159; 307/360, 361, 362, 494

[56] References Cited

U.S. PATENT DOCUMENTS

| | | | |
|---|---|---|---|
| 4,057,795 | 11/1977 | Timsit | 341/159 |
| 4,285,104 | 4/1980 | Yamakoshi et al. | 307/362 X |
| 4,686,508 | 8/1987 | van de Grift et al. | 341/159 |
| 5,126,742 | 6/1992 | Schmidt et al. | 341/156 |
| 5,204,679 | 4/1993 | Jessner et al. | 341/159 |

Primary Examiner—Howard L. Williams
Attorney, Agent, or Firm—Robert P. Biddle; Jerry A. Miller; Lise A. Rode

[57] ABSTRACT

In an analog signal comparator circuit, first and second inversion output currents to the first and second reference values of input analog signals, a plurality of the first and second dividually inversion outputs divided the first and second non-inversion output currents, and the first and second dividually non inversion output currents are combined respectively and added, and the comparison output corresponding to the virtual reference value for dividing the first reference value, and the first reference value and the second reference value equally are outputted. Thus, the number of comparators can be decreased comparing with the necessary numbers of reference values, and by decreasing the number of elements the input capacities can be decreased and differential linearity errors can be reduced.

5 Claims, 22 Drawing Sheets (PRIOR ART) (PRIOR ART)

| | VA1 = VB1 | VA2 = VB2 | VA3 = VB3 | VA4 = VB4 | VA5 = VB5 |
|---|---|---|---|---|---|
| $\Delta V = 2mV$ | $V_{REF1}$ | $V_{REF1} + \frac{0.9998}{4}$ | $V_{REF1} + \frac{\Delta V}{2}$ | $V_{REF1} + \frac{3.0001}{4}$ | $V_{REF1} + \Delta V$ |
| $\Delta V = 8mV$ | $V_{REF1}$ | $V_{REF1} + \frac{0.9970}{4}$ | $V_{REF1} + \frac{\Delta V}{2}$ | $V_{REF1} + \frac{3.0030}{4}$ | $V_{REF1} + \Delta V$ |
| $\Delta V = 32mV$ | $V_{REF1}$ | $V_{REF1} + \frac{0.9538}{4}$ | $V_{REF1} + \frac{\Delta V}{2}$ | $V_{REF1} + \frac{3.0462}{4}$ | $V_{REF1} + \Delta V$ |
| $\Delta V = 64mV$ | $V_{REF1}$ | $V_{REF1} + \frac{0.8311}{4}$ | $V_{REF1} + \frac{\Delta V}{2}$ | $V_{REF1} + \frac{3.1688}{4}$ | $V_{REF1} + \Delta V$ |

FIG. 21

INTERPOLATION TYPE FLASH ANALOG-TO-DIGITAL CONVERTER

BACKGROUND OF THE INVENTION

1. Field Of The Invention

This invention relates to an analog to digital convertor apparatus and is suitably applied to a signal comparison unit of analog-digital converter which outputs analog input signals upon sequentially converting to digital signals, for example.

2. Description Of The Related Art

Heretofore, in the fields of audio apparatus and meter instruments, an analog-to-digital converter (hereinafter referred to as A/D converter) is used in order to signal process various analog signals digitally, such as audio signal for recording or reproducing, and various conversion systems have been proposed according to the field used and preciseness and speed required.

Especially, in the case where high speed operation and preciseness are required, it is common that a parallel (flash) type A/D converter or series-parallel (subranging) type A/D converter is used and various circuit constructions have been considered corresponding to the required speed and preciseness even in the same conversion system.

More specifically, even in the same parallel A/D converter as shown in FIGS. 1 and 2, various circuit constructions have been considered corresponding to the number of bits and preciseness.

In a case of parallel type A/D converter 1 having 8-bit resolution (FIG. 1), when 255 reference electric potentials are generated at each reference resistance R1–R256 by supplying reference voltages VRT and VRB to both terminals of 256 reference resistances R1–R256 which are connected in series, each reference electric potential generated and analog signal $V_{IN}$ to be inputted in common to each input terminal is compared respectively at comparators. C1–C255.

This parallel type A/D converter 1 supplies comparison outputs of comparators C1–C255 to an encoder 2 through differentiating circuits D1–D255 which are constituted by AND circuits, and outputs sequentially 8-bit 2 value data converted by said encoder 2 through a logical circuit which is constituted by a buffer B1 and OR circuits OR1–OR8 and an output buffer 3 as output data D0–D7.

However, since it is necessary to have $2^{10}-1$ (=1023) comparators if we try to construct the parallel type A/D converter having 10-bit resolution in accordance with the construction as described above, a parallel type A/D converter 5 which can be constituted by $2^9-1$ (=511) comparators by using interpolation has been proposed.

FIG. 2 is a block diagram showing a part of parallel A/D converter 5, and comparators Cm and Cm−1 which are constituted by differential amplifiers latch a comparison output $S_m$, an inversion output $IS_m$ and a comparison output $S_{m-1}$, an inversion output $IS_{m-1}$ at latch circuits 6m and 6m−1 respectively, and simultaneously the number of comparators will be decreased by latching the comparison output $S_m$ and the inverse output $IS_{m-1}$ of adjacent comparators Cm and Cm−1 at the latch circuit 7m for interpolation and supplying to a decoder 8.

At this point, reference electric potentials $V_{REF1}$ and $V_{REF2}$ are supplied to comparators Cm and Cm−1 respectively, and the comparison result of said reference electric potentials $V_{REF1}$ and $V_{REF2}$ ($>V_{REF1}$) and the analog signal $V_{IN}$ will be outputted as the comparison output $S_m$, inversion output $IS_m$ and the comparison output $S_{m-1}$, inversion output $IS_{m-1}$ (FIGS. 3A and 3B).

As shown in FIGS. 2 and 3B, the latch circuits 6m and 6m−1 inverse the latch output when the analog input signal $V_{IN}$ exceeds reference voltage $V_{REF1}$ and $V_{REF2}$ and the comparison output Sm to be inputted from comparators Cm and Cm−1 of the previous stage and the inversion output $IS_m$, and the comparison output $S_{m-1}$ and the inverse output $IS_{m-1}$ intersect respectively, and also the latch circuit 7m inverses the latch output when the comparison output $S_m$ of comparator Cm and the inversion output $IS_{m-1}$ of comparator Cm−1 intersect each other.

On the other hand, since the latch circuit 7m inverses the latch output when an intermediate electric potential between reference voltages $V_{REF1}$ and $V_{REF2}$ (hereinafter referred to as virtual reference electric potential), which is not given in the parallel type A/D converter 5 practically, and the input analog signal $V_{IN}$ intersect each other and thus the number of comparators will be decreased by half.

With this arrangement, the parallel A/D converter 5 is able to decrease the number of comparators by half, and the input capacity which will be especially important in the case of high speed driving can be decreased and simultaneously, differential linearity error can be decreased in utilizing the virtual reference electric potential.

As shown in FIG. 4A in the conventional parallel A/D converter 1, the reference electric potential $V_{REF}$ (N) shifts and the code N to overlap with the reference electric potential $V_{REF}$(N+1) disappears; on the other hand, in case of interpolating by using the virtual reference electric potential as shown in FIG. 4B, since reference electric potentials $V_{REF}$(N−1) and $V_{REF}$(N+1) are virtual reference electric potentials to be formed by interpolation, virtual reference electric potentials $V_{REF}$ (N−1) and $V_{REF}$(N+1) shift corresponding to the shift of reference electric potential $V_{REF}$(N) if the reference electric potential $V_{REF}$(N) shifts.

However, there has been a problem that this A/D conversion method cannot interpolate more than that number of comparators in spite of the fact that this method can interpolate the number of comparators by half.

Similarly, as the A/D converter having 10-bit resolution, a 3 stage A/D converter, which is capable of decreasing the number of comparators further, having low manufacturing cost and decreasing electric power consumption, has been proposed.

As shown in FIG. 5, this A/D converter 10 generates upper 4-bit data at first by 16 reference potentials at the primary stage (FIG. 5A), at the following second stage, generates (0)–(7) medium 3-bit data and (−1) and (8) surplus bits (FIG. 5B), and at the last third stage, it obtains lower 3-bit (FIG. 5C), and it is composed of a total of 32 comparators.

At this point, the third stage of A/D converter 10 is constituted by connection of a pair of differential amplifiers 11A and 11B as shown in FIG. 6, and the input analog signal $V_{IN}$ is inputted to one input terminal and the second stage reference voltages $V_{REF1}$ and $V_{REF2}$ are inputted to the other input terminal respectively.

The differential amplifiers 11A and 11B are connected with two pairs of resistance sequences connected in series the resistance having a resistance ratio of 3:2:4:12 and by combining output voltages Va1-Va4 and Vb1-Vb4 which are differential voltages in connecting taps of each resistance, reference voltages divided into eight equal parts are generated by interpolation and conversion characteristic with minor connection errors can be obtained.

More specifically, as shown in FIG. 7, there are generated interpolation voltages V1, V2, V3, V4, V5, V6 and V7 which are obtained by dividing the second stage reference voltages $V_{REF1}$ and $V_{REF2}$ into eight equal parts, according to the voltage ratio of output voltages Vb1 and Va4 (=3:21), voltage ratio of output voltages Vb1 and Va3 (=3:9), the voltage ratio of output voltages Vb1 and Va2 (=3:5), the voltage ratio of output voltages Vb2 and Va2 (=5:5), the voltage ratio of output voltages Vb2 and Va1 (=5:3), the voltage ratio of output voltages Vb3 and Va1 (=9:3), and the voltage ratio of output voltages Vb4 and Va1 (=21:3).

However, in this case, more than a half of interpolation can be performed; on the other hand, it becomes necessary to have one additional differential amplifier. Difference in rate of delivery also arises because of difference in time constant for generating various differential outputs according to different resistance values. This could not be used for the parallel type A/D converter.

OBJECTS AND SUMMARY OF THE INVENTION

In view of the foregoing, first object of this invention is to decrease the number of the comparators in the A/D converter circuit by interpolation process of various stages and equal processing speed.

Second object of this invention is to realize the comparison of input analog signal with numerous reference values with smaller differential input stages as compared with the number of reference value and thus, to decrease the input capacity by decreasing the number of elements.

Third object of this invention is to reduce the differential linearity errors in the A/D converter by interpolation process of various stages and equal processing speed.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 21 is a diagram illustrating the intersection potential of each composite collector current.

DETAILED DESCRIPTION OF THE INVENTION

Preferred embodiments of this invention will be described with reference to the accompanying drawings:

In the first place, the principle of interpolation in accordance with current shunting of the present invention will be described.

Figure 8:
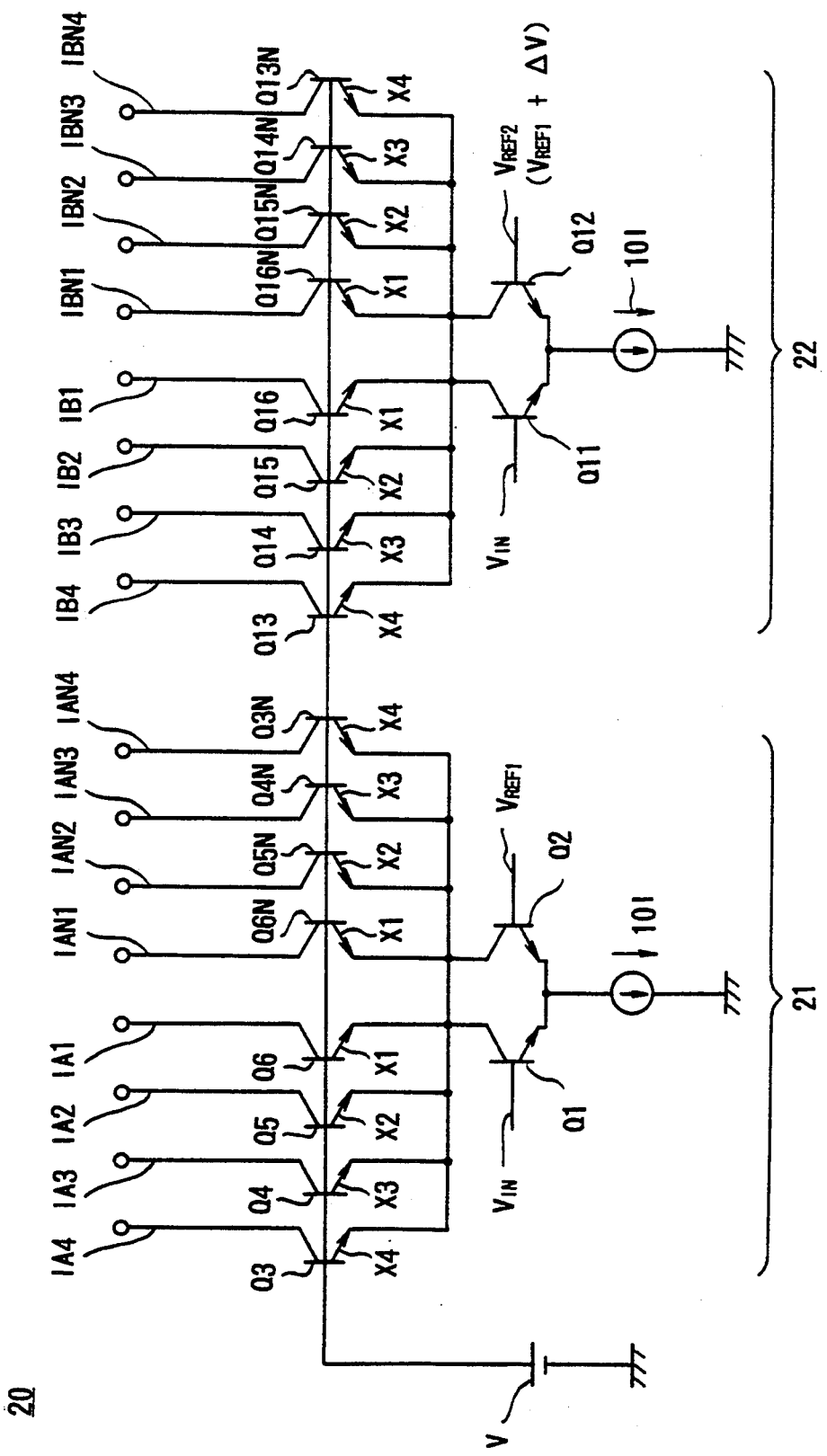
FIG. 8 is a connection diagram illustrating shunting of collector currents in the analog signal comparator according to the present invention.
Figure 9:
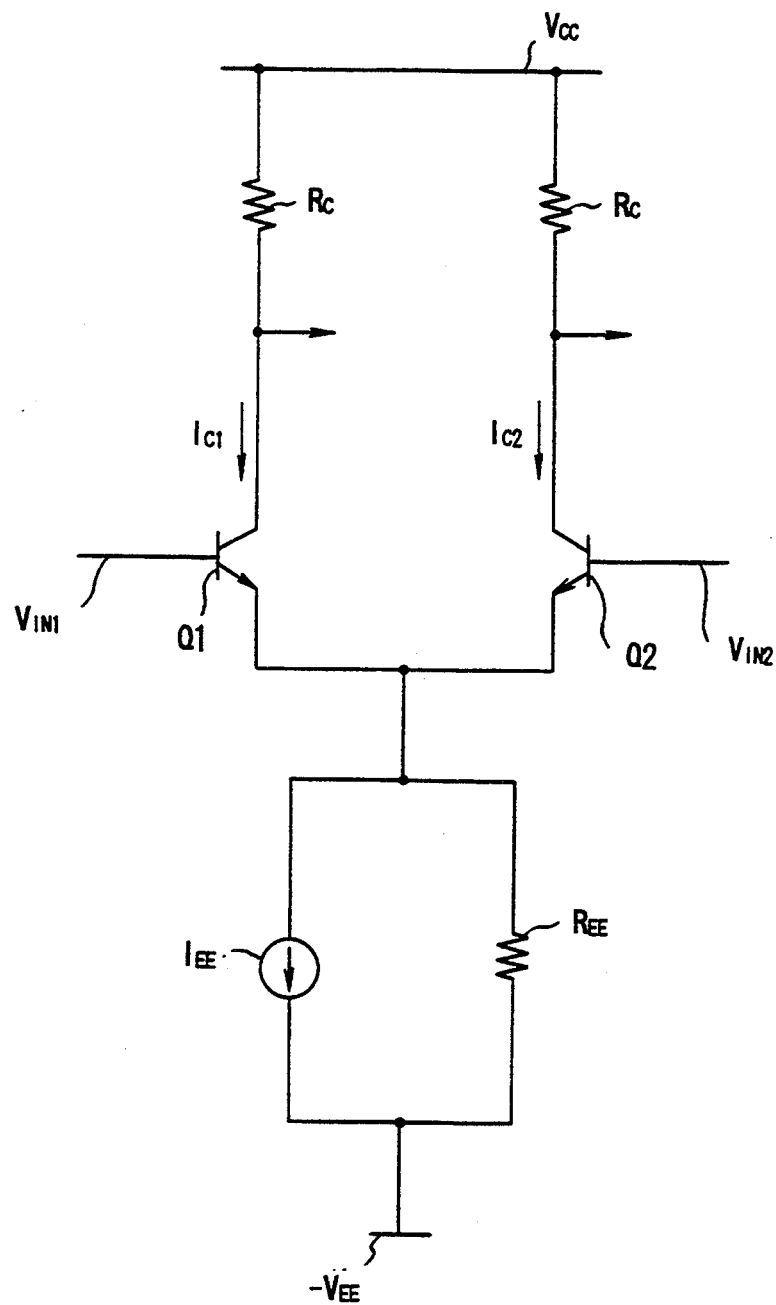
FIG. 9 is a connection diagram illustrating differential pair wherein the collector currents flow in the comparator circuit shown in FIG. 8.

As shown in FIG. 8, in the interpolation process of multiple stages in this embodiment, a plurality of transistors having different emitter areas are cascade connected in a pair of differential pair in parallel, so that, flow dividually and the currents divided are recombined and added each other to obtain comparison outputs to numerous virtual reference electric potentials.

Figure 1:
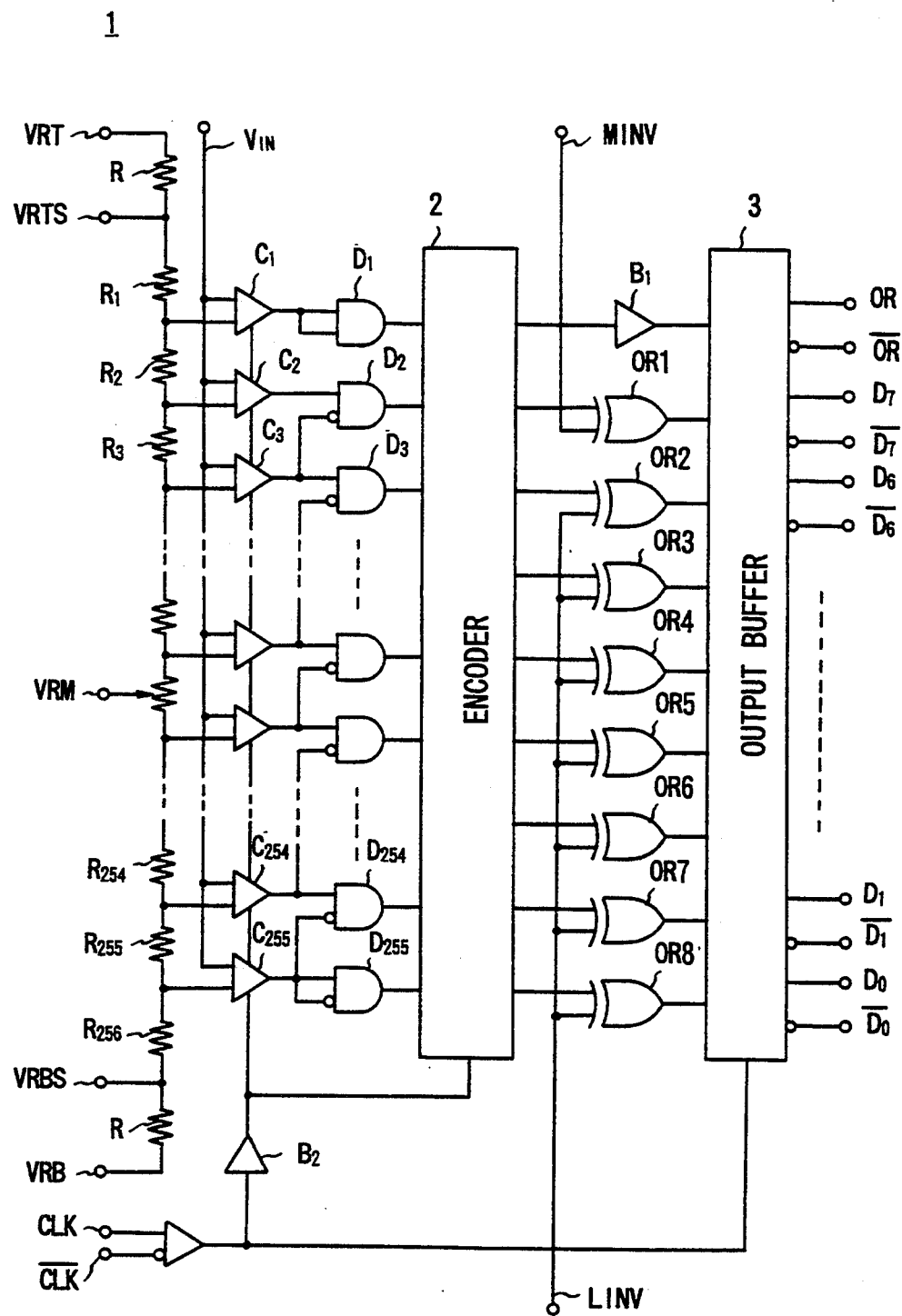
FIG. 1 is a connection diagram illustrating conventional parallel A/D converter.
Figure 2:
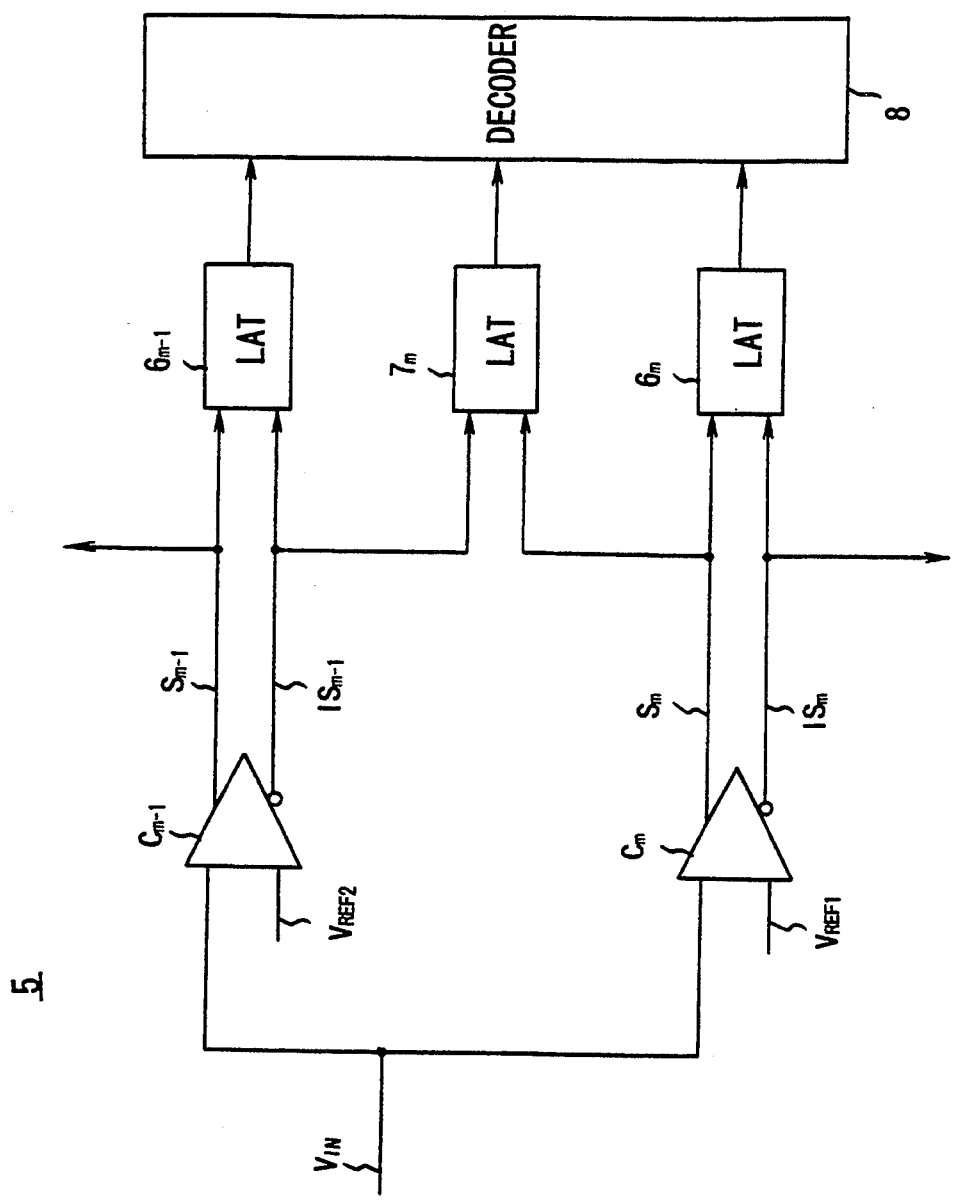
FIG. 2 is a connection diagram illustrating conventional parallel A/D converter.
Figure 3A:
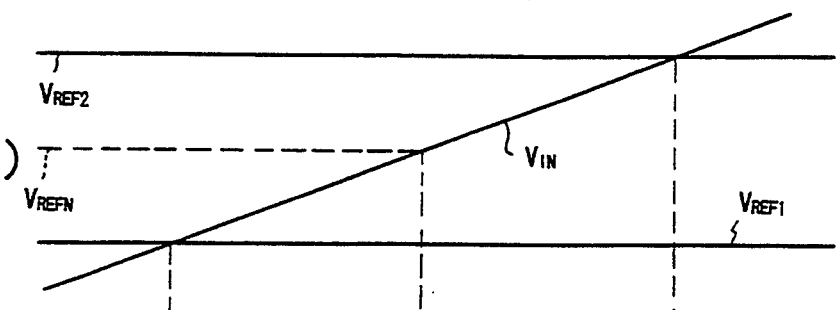
FIGS. 3A and 3B are characteristic curvilinear diagrams illustrating the conventional A/D converter shown in FIG. 2.
Figure 3B:
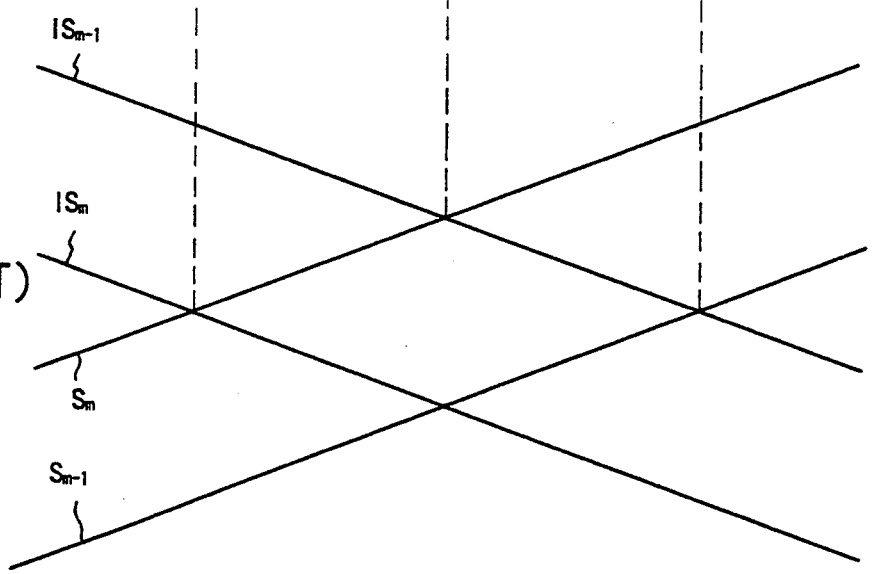
Figure 4A:
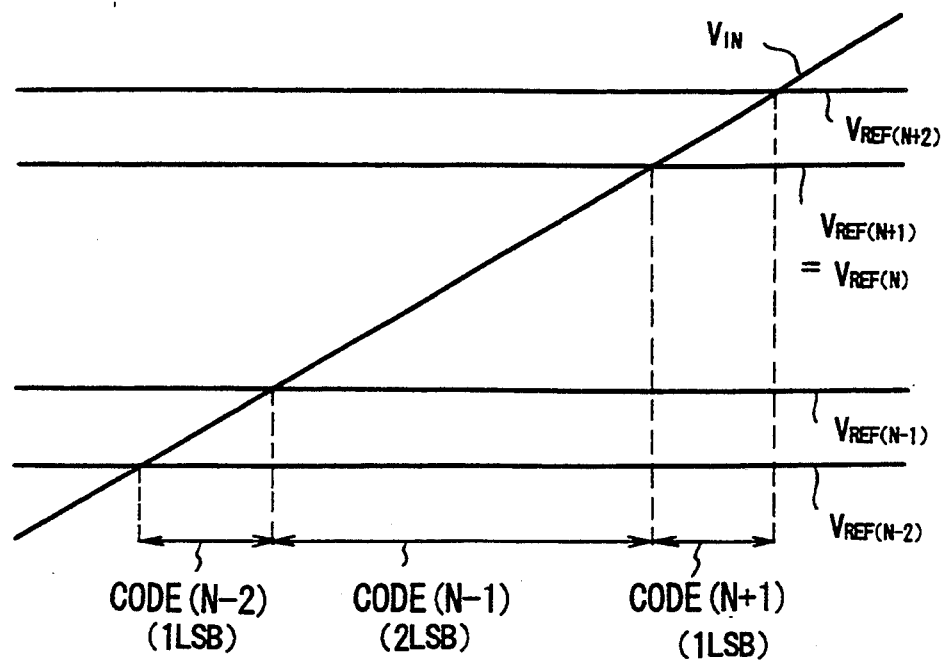
FIGS. 4A and 4B are characteristic curvilinear diagrams illustrating the improvement of linearity error according to interpolation.
Figure 4B:
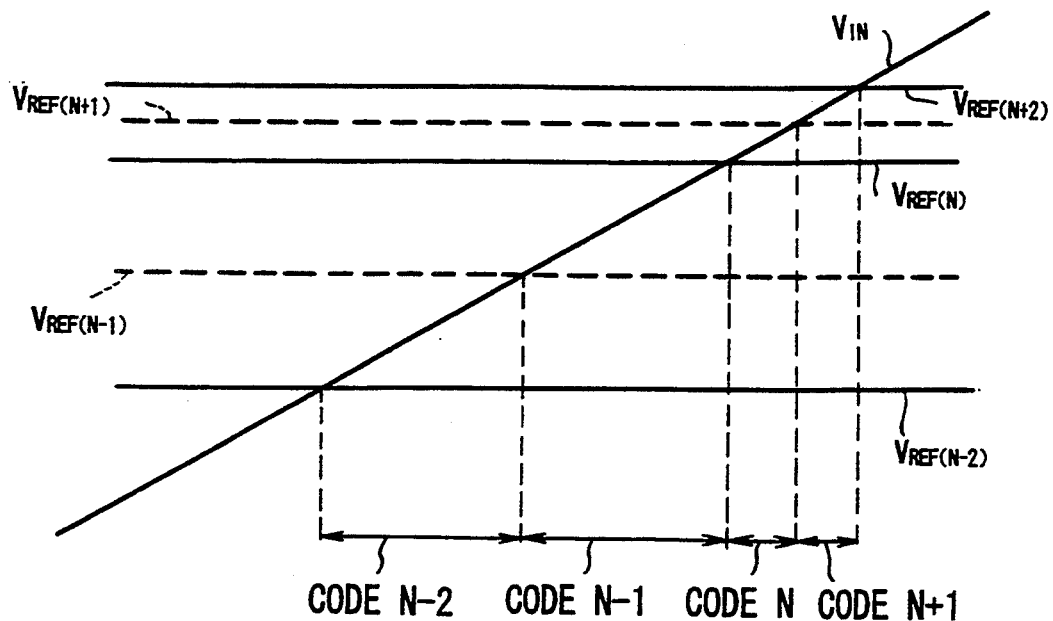
Figures 5A, 5B, 5C:
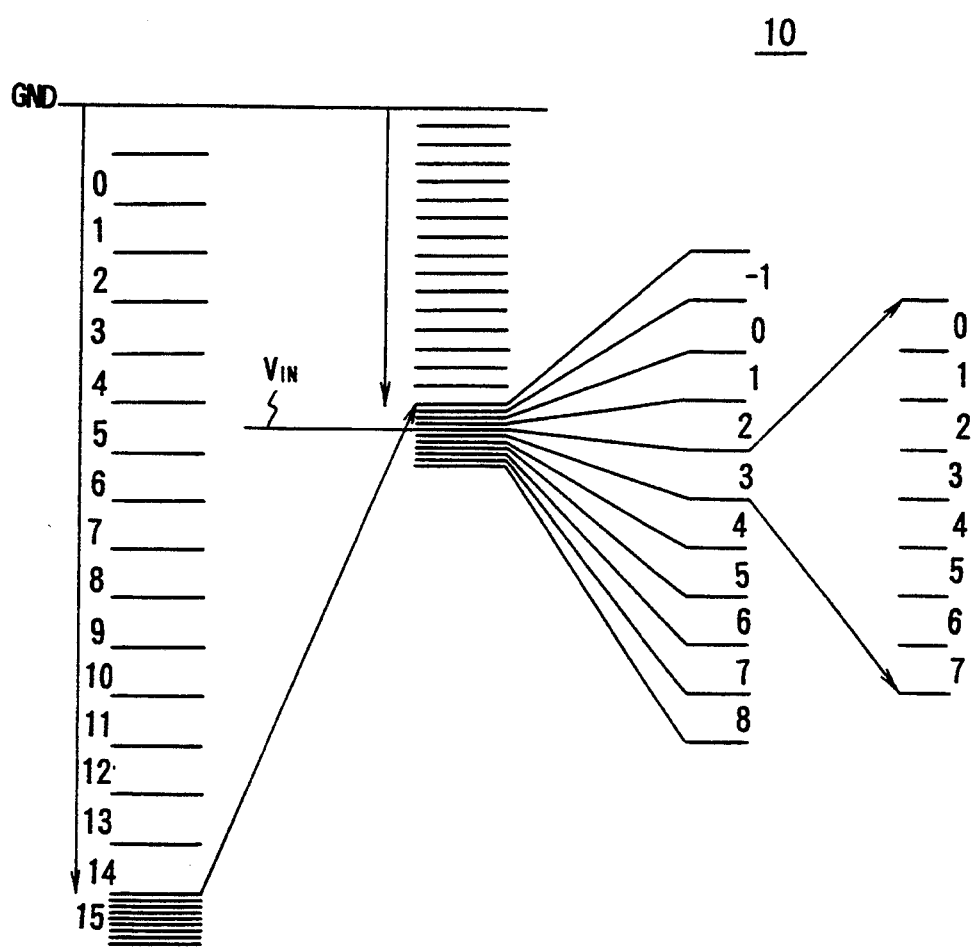
FIGS. 5A to 5C are brief linear diagrams illustrating the conventional A/D converter according to the multiple stage conversion method.
Figure 6:
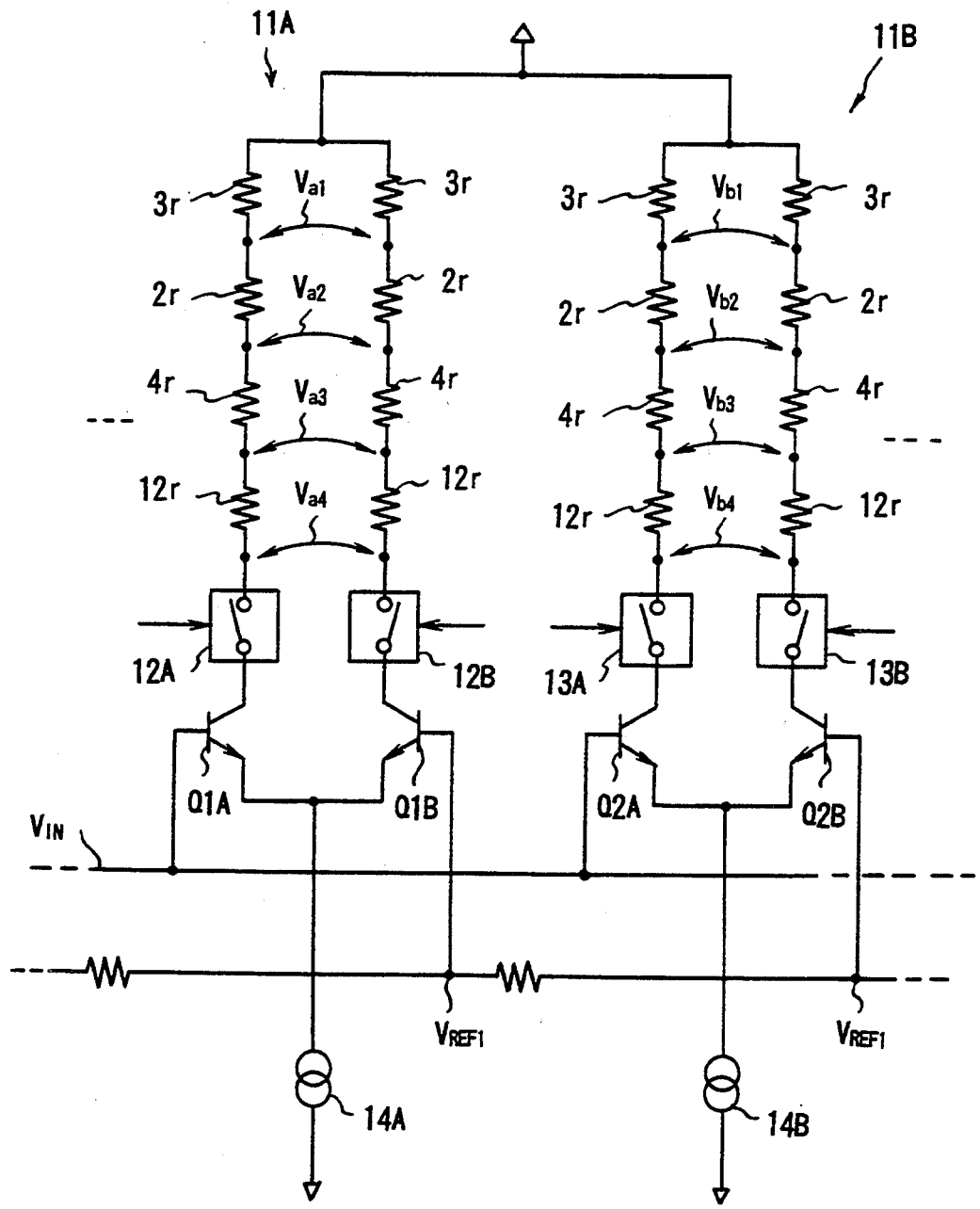
FIG. 6 is a connection diagram showing a third comparison stage in the conventional A/D converter shown in FIG. 5.
Figure 7:
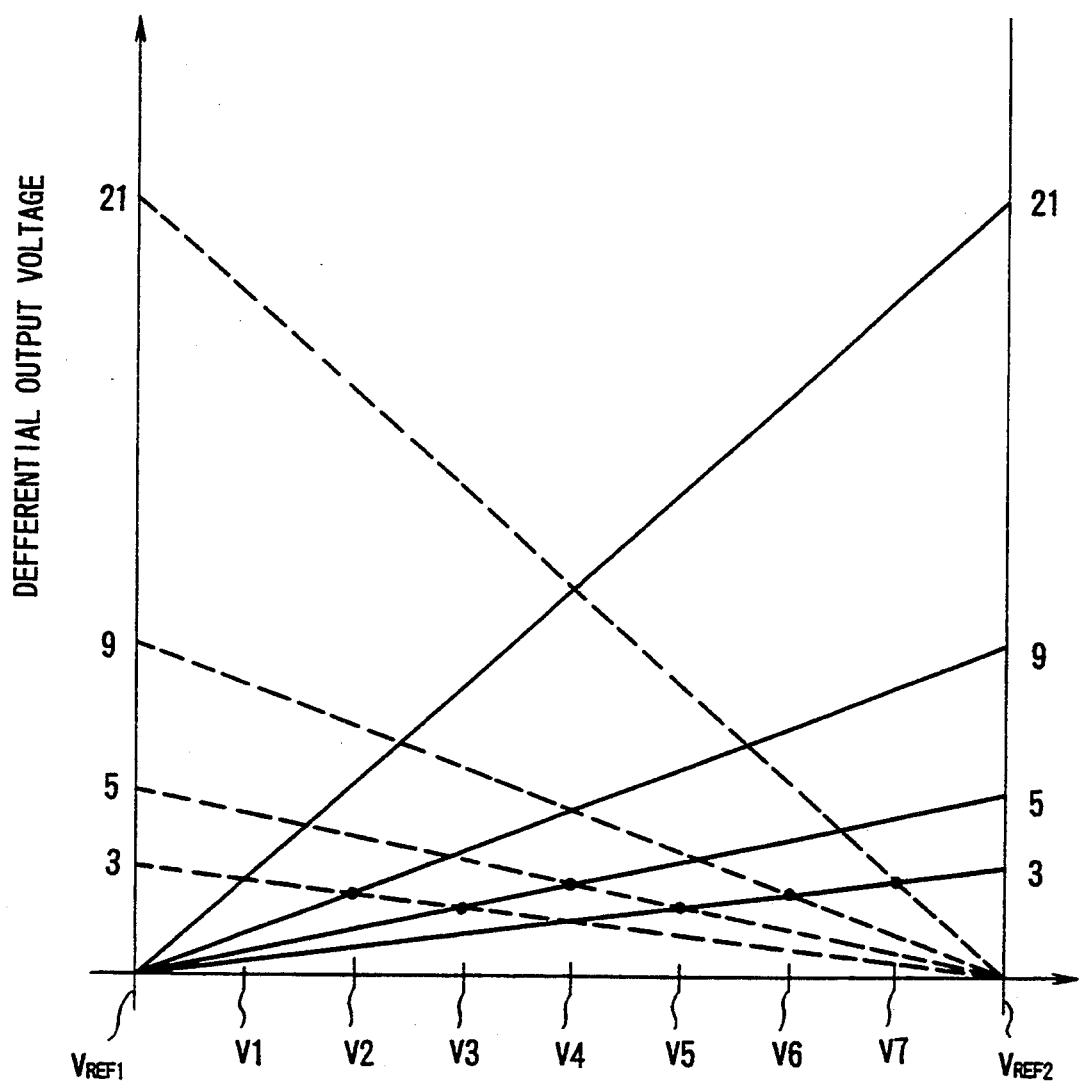
FIG. 7 is a characteristic curvilinear diagram illustrating the third comparison stage shown in FIG. 6.
Figure 10:
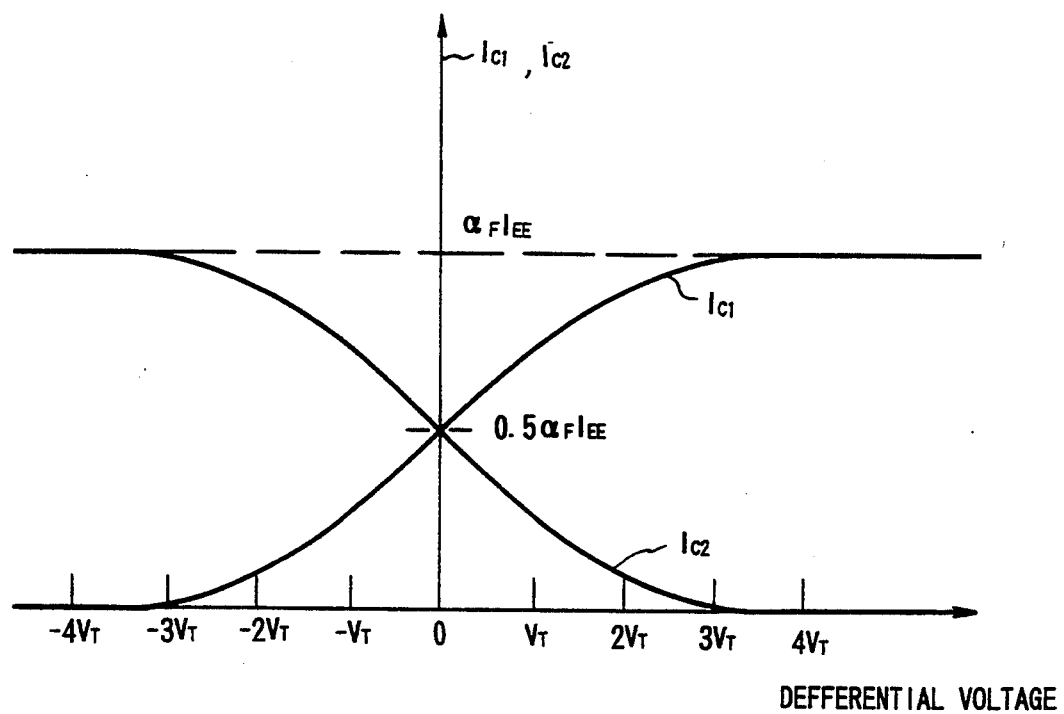
FIG. 10 is a characteristic curvilinear diagram illustrating the relation between differential voltage in a pair of differential inputs and collector currents.

Here, the differential pair which is the basic construction of connection in FIG. 7, i.e., as shown in FIG. 8, collector currents $I_{c1}$ and $I_{c2}$ which flow to the differential pair to be formed with emitter connection of NPN type transistors Q1 and Q2 (Q11 and Q12) have the relation as defined in the following equations:

$$I_{C1} = \frac{\alpha_F \cdot I_{EE}}{1 + \exp\left(-\frac{V_{id}}{V_T}\right)} \quad (1)$$

$$I_{C2} = \frac{\alpha_F \cdot I_{EE}}{1 + \exp\left(\frac{V_{id}}{V_T}\right)} \quad (2)$$

where emitter current which flows to the common emitter is $I_{EE}$, and as shown in FIG. 10, in the case where differential voltage is small, it is considered that characteristic curves of two collector currents intersect each other.

In this connection, in the equations (1) and (2), $V_{id}$ is differential voltage between differential input $V_{IN1}$ and $V_{IN2}$ to be inputted to transistors Q1 and Q2, and $V_T$ is thermal voltage.

Here, the ratio of emitter area of respective transistors Q3, Q4, Q5, Q6 and Q6N, Q5N, Q4N, Q3N (transistor Q13, Q14, Q15, Q16 and Q16N, Q15N, Q14N, Q13N) to be cascade connected to each collector of differential pair, 21 and 22, in FIG. 8 will be 4:3:2:1 and 1:2:3:4 in order.

At this point, where emitter current of respective differential pairs 21 and 22 is 10I, collector currents IA4, IA3, IA2, IA1 and LAN1, LAN2, LAN3, LAN4 (IB4, IB3, IB2, IB1 and IBN1, IBN2, IBN2, IBN4) in proportion to the emitter area will flow in respective transistors Q3–Q6 and Q6N–Q3N (Q13–Q16 and Q16N–Q13N) cascade connected.

These collector currents IA4-IA1, IAN1-IAN4, IB4-IB1, IBN1-IBN4 are obtained in the following equations, where reference electric potentials to be given to the differential pairs 21 and 22 are $V_{REF1}$ and $V_{REF2}$ ($=V_{REF1}+\Delta V$):

$$IAn = \frac{n \cdot I}{1 + \exp\left(-\frac{V_{in} - V_{REF1}}{V_T}\right)} \quad (n = 1\text{-}4) \quad (3)$$

$$IANn = \frac{n \cdot I}{1 + \exp\left(\frac{V_{in} - V_{REF1}}{V_T}\right)} \quad (n = 1\text{-}4) \quad (4)$$

$$IBn = \frac{n \cdot I}{1 + \exp\left(-\frac{V_{in} - (V_{REF1} + \Delta V)}{V_T}\right)} \quad (n = 1\text{-}4) \quad (5)$$

$$IBNn = \frac{n \cdot I}{1 + \exp\left(\frac{V_{in} - (V_{REF1} + \Delta V)}{V_T}\right)} \quad (n = 1\text{-}4) \quad (6)$$

Figure 11:
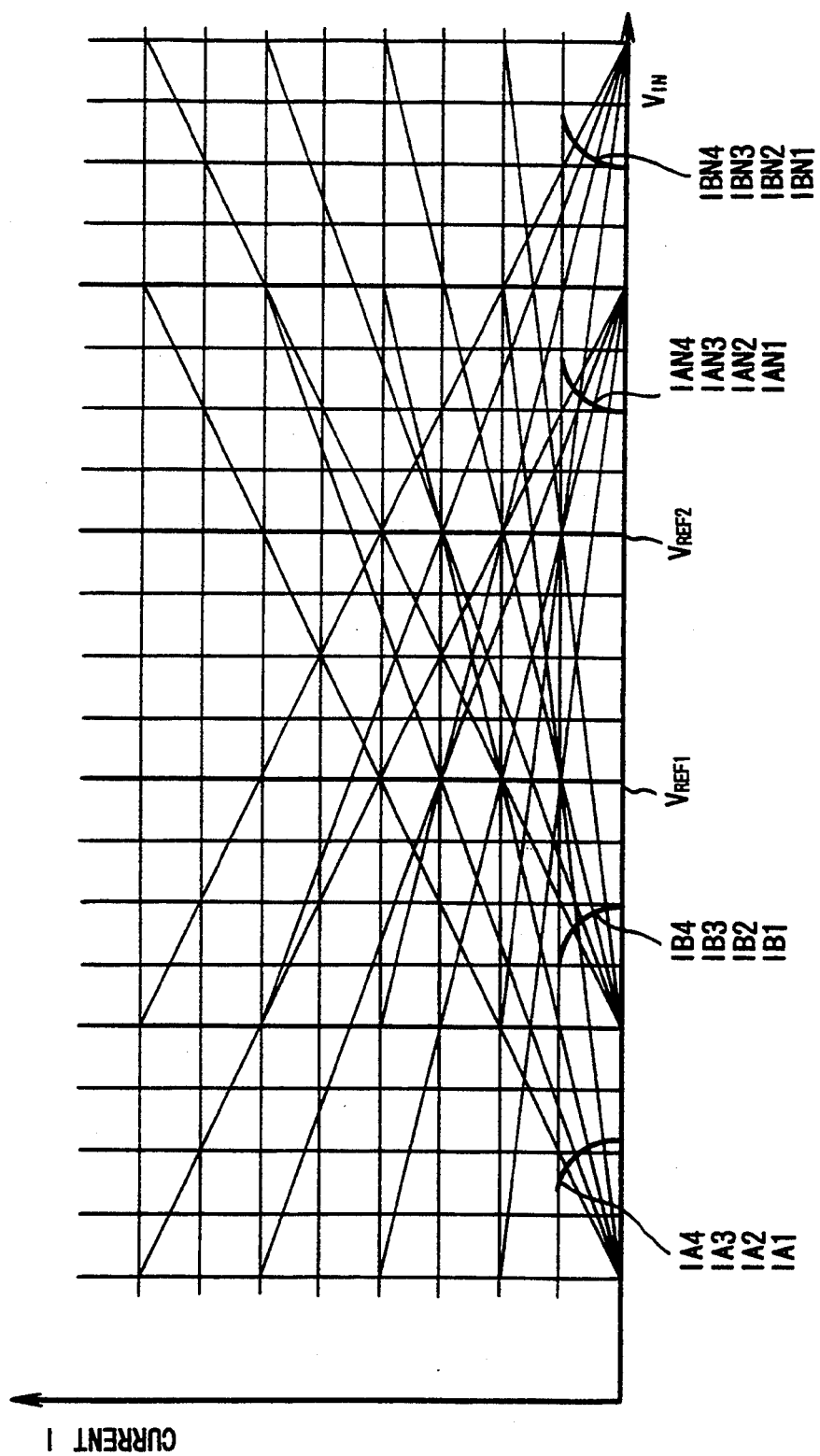
FIG. 11 is a characteristic curvilinear diagram illustrating the relation between differential voltage in a pair of differential inputs and collector currents shunted.

Furthermore, at this point, as illustrated in FIG. 11, quantity of electric current to the voltage difference of differential inputs of collector currents IA4-IA1, IAN1-IAN4 and IB4-IB1, IBN1-IBN4 of the differential pairs 21 and 22 are given as two pairs of electric current curves which intersect at the reference voltages $V_{REF1}$ and $V_{REF2}$ respectively. In this embodiment, by combining said two pairs of collector currents basically, the virtual reference voltage to divide reference voltages $V_{REF1}$ and $V_{REF2}$ into four equal parts are interpolated.

Figure 12:
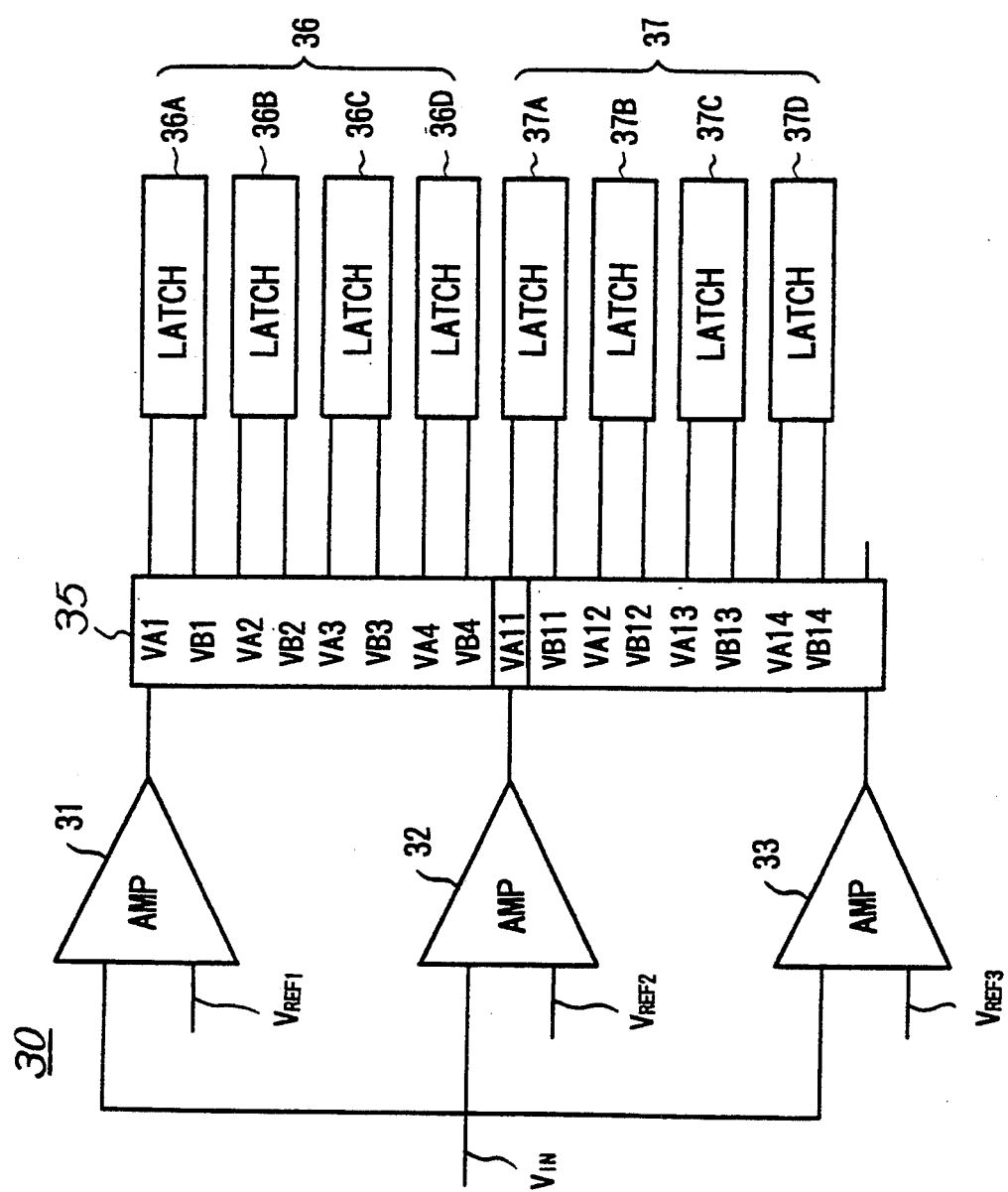
FIG. 12 is a block diagram showing the basic construction of analog signal comparator according to the present invention.
Figure 13:
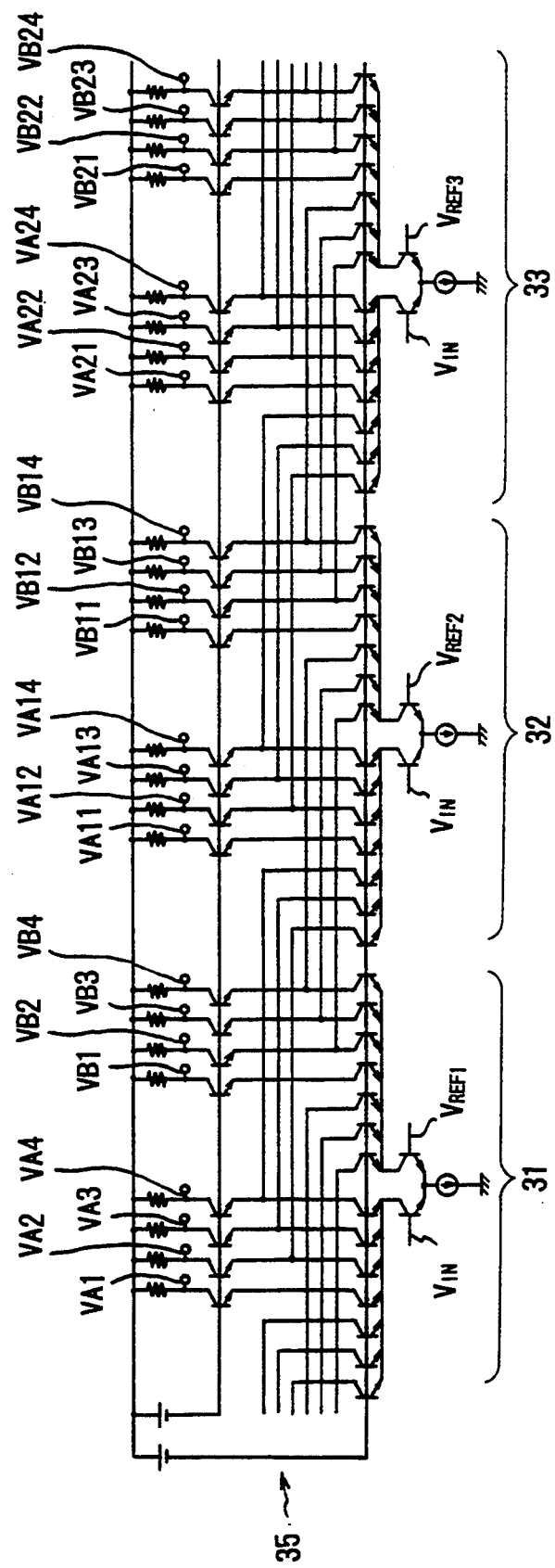
FIG. 13 is a connection diagram showing one of the embodiments in the present invention.

Next, referring to the drawings, a first embodiment of the present invention will be described in detail:

In FIGS. 12 and 13, 30 generally shows the basic construction of comparison stages in the parallel type A/D converter and comparison outputs to virtual reference voltage which divide reference voltages $V_{REF1}$ and $V_{REF2}$, $V_{REF2}$ and $V_{REF3}$ to be given to respective differential amplifiers 31 and 32, 32 and 33 into four equal parts respectively. The collector currents of 3 differential pairs 21, 32 and 33 at the interpolation output unit 35 are combined to be outputted to latch circuits 36 (36A, 36B, 36C, 36D) and 37 (37A, 37B, 37C, 37D).

Figure 14:
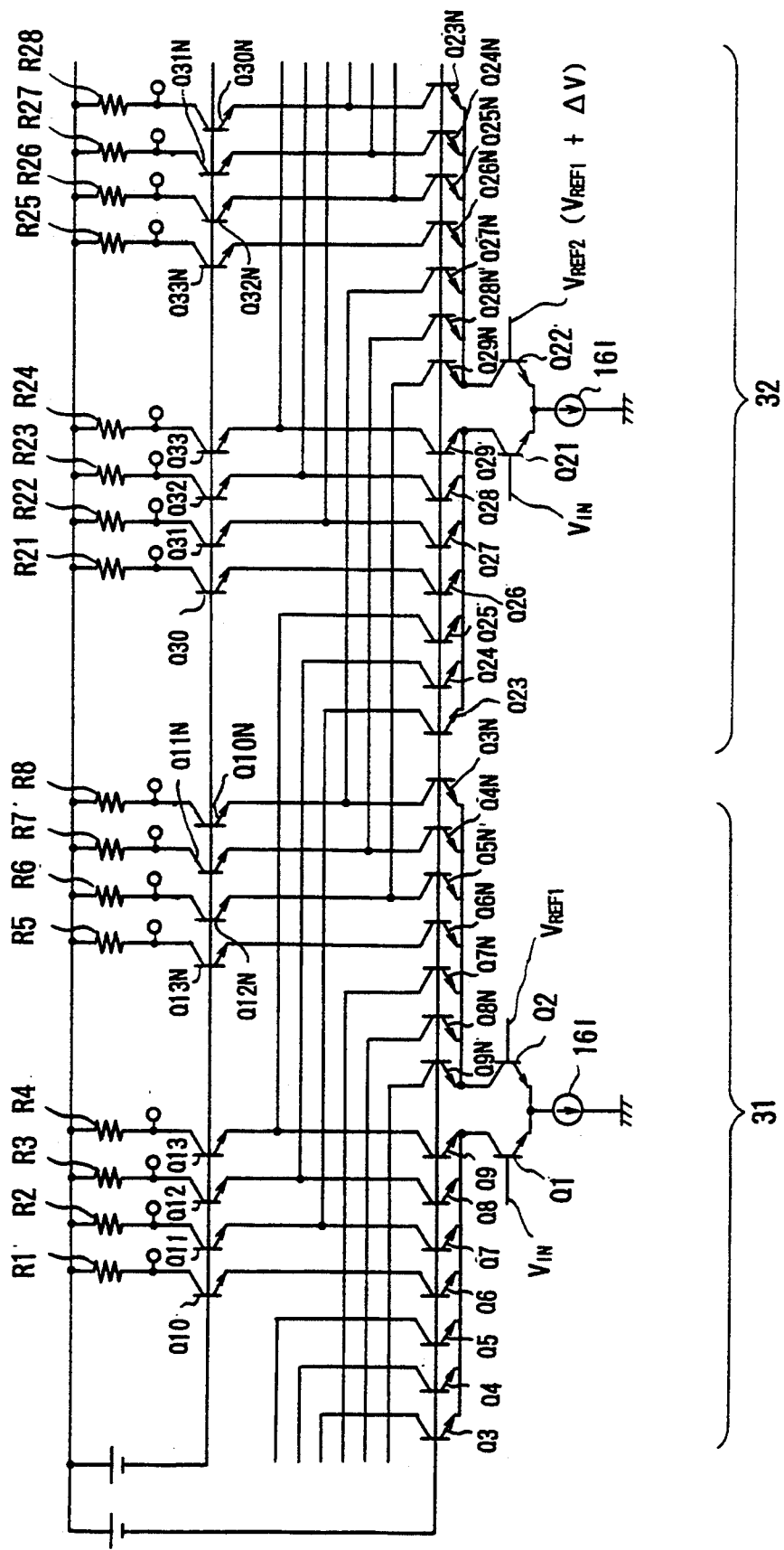
FIG. 14 is a connection diagram illustrating differential pairs to be supplied the first and second reference potentials.
Figure 15:
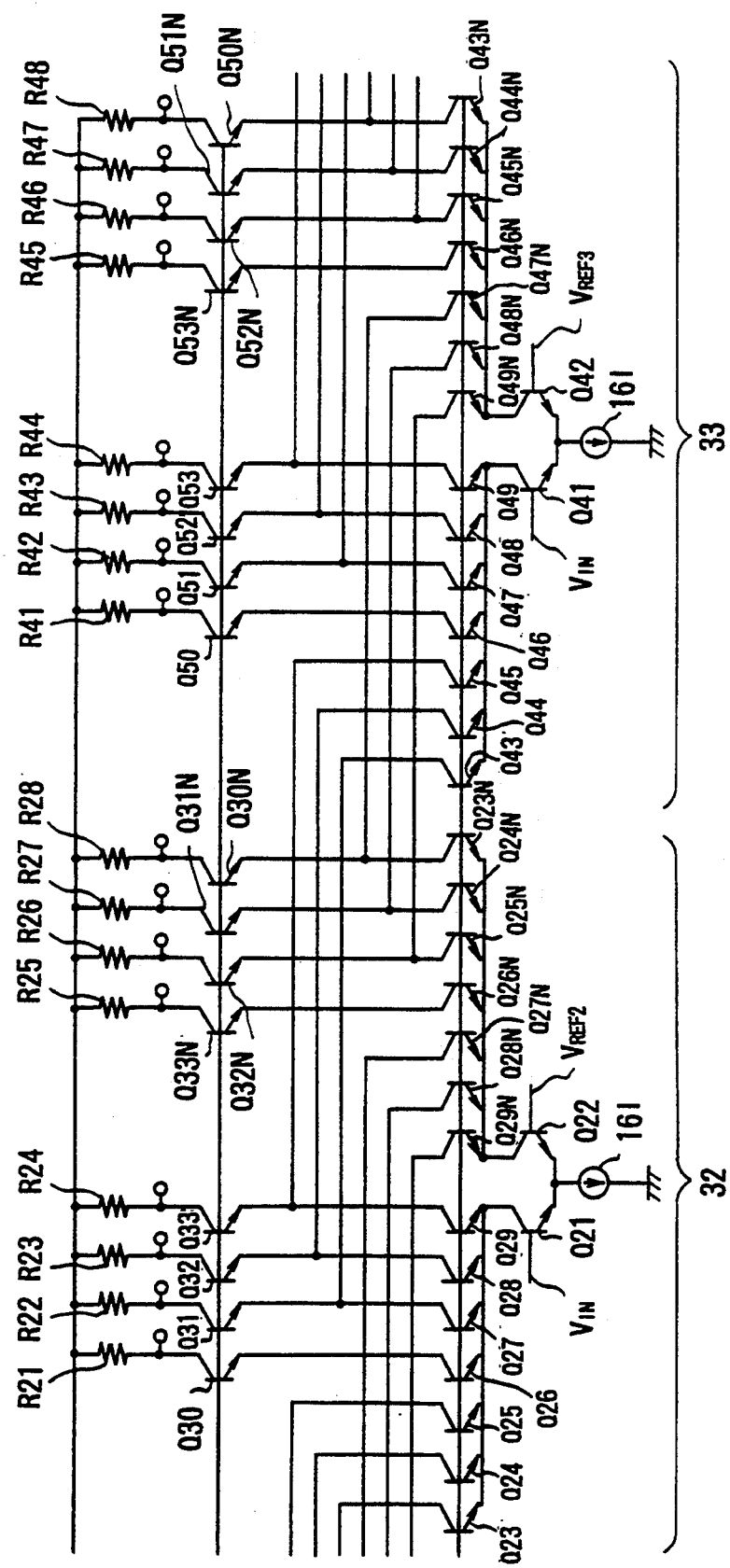
FIG. 15 is a connection diagram illustrating differential pairs to be supplied the second and third reference potentials.

In the case of this embodiment, as shown in scaling up in FIGS. 14 and 15, collectors of transistors Q1 and Q2 composing a differential pair 31 are cascade connected in common to transistors Q3, Q4, Q5, Q6, Q7, Q8, Q9 and Q9N, Q8N, Q7N, Q6N, Q5N, Q4N, Q3N having ratios of emitter areas 1:2:3:4:3:2:1 composing an interpolation output unit 35 and collector currents, which flow dividually to become emitter current 16I, are flowed corresponding to the ratio of emitter area (FIG. 14).

Similarly, collectors of transistors Q21, Q22 and Q41, Q42 comprising differential pairs 32 and 33 are cascade connected to transistors Q23-Q29, Q29N-Q23N and Q43-Q49, Q49N-Q43N having the ratio of emitter areas 1:2:3:4:3:2:1 respectively and also the emitter current 16I are dividually flowed and load resistances are actuated (FIG. 15).

The cascade transistors Q6-Q0 and Q6N-Q3N to be used for dividing the collector current to a plurality of current values are further cascade connected to transistors Q10-Q13 and Q13N-Q10N respectively, and the connection node of transistors Q7-Q9 and Q6N-Q3N and cascade transistors Q11-Q13 and Q13N-Q3N are connected in common to collectors of cascade transistors Q23-Q25 of the adjacent differential amplifier 22 respectively.

The emitter areas of transistors Q7 and Q23, Q8 and Q24, and Q9 and Q25 (transistors Q5N and Q29N, Q4N and Q28N, and Q3N and Q27N) to be connected each other with collectors are related in the ratios 3:1, 2:2 and 1:3, respectively.

Also, collectors of transistors Q10-Q13 and Q10N-Q13N are connected to the load resistances R1-R8 which have the same resistance value R, collector currents IA1-IA3 and IAN1-IAN3 divided corresponding to the ratio of emitter areas are added again and composite collector currents in proportion to the comparison output of reference potentials to divide the reference potentials $V_{REF1}$ and $V_{REF2}$ equally and the input voltage is generated.

More specifically, the A-D converter 30 generates the inversion output and in-phase output voltage corresponding to the input analog signal $V_{IN}$ with the virtual reference potential V1 ($=V_{REF1}+\Delta V/4$), V2 ($=V_{REF1}+2\cdot\Delta V/4$) and V3 ($=V_{REF1}+3\cdot\Delta V/4$), which divide the reference potential $V_{REF1}$, reference potentials $V_{REF1}$ and $V_{REF2}$ ($=V_{REF1}+\Delta V$) into four equally in the load resistance R1-R4 and R5 to R8 successively.

In like manner, cascade transistors Q23-Q29, Q23N-Q29N and Q41-Q49, Q41N-Q49N to be connected to the differential pairs 22 and 23 are connected in order to combine collector currents flowing in the adjacent differential pair, and are arranged to generate output voltages corresponding to the input analog signal $V_{IN}$ with virtual reference potentials V11 ($=V_{REF2}+\Delta V/4$), V12 ($=V_{REF2}+2\cdot\Delta V/4$), V13 ($=V_{REF2}+3\cdot\Delta V/4$) and virtual reference potentials V21 ($=V_{REF3}+3\cdot\Delta V/4$) which divide reference potentials $V_{REF2}$, $V_{REF3}$ ($=V_{REF2}+\Delta V$) and reference electric potentials $V_{REF3}$ and $V_{REF4}$ ($=V_{REF3}+\Delta V$) into four parts equally, in load resistances R21–R28 and R41–R48 having the same resistance value R.

At this point, the emitters of the cascade transistors Q11-Q13, Q12N-Q10N (Q31-Q33, Q32N-Q30N and Q51-Q53, Q52N-Q50N), the collectors of which are connected to load resistances R2-R4, R6-R8 (R22-R24, R26-R28 and R42-R44, R46-R48) are connected to the collector capacity of cascade transistors for flowing dividually (equipped with collector capacity for four, respectively) which will be observed as capacity for one, thereby decreasing the time constant to be able to realize the high speed operation.

In this connection, collector currents flowing in the load resistances R1-R8, R21-R28 have the same current value 4I and since the time constant determined by load capacity and collector capacity is constant, the signal speeds become to be equal.

According to the foregoing construction the A-D converter 30 inputs the analog signal $V_{IN}$ and supplies to inverse input terminals of differential amplifiers 31, 32 and 33 which constitute the first stage comparators respectively.

Figure 16:
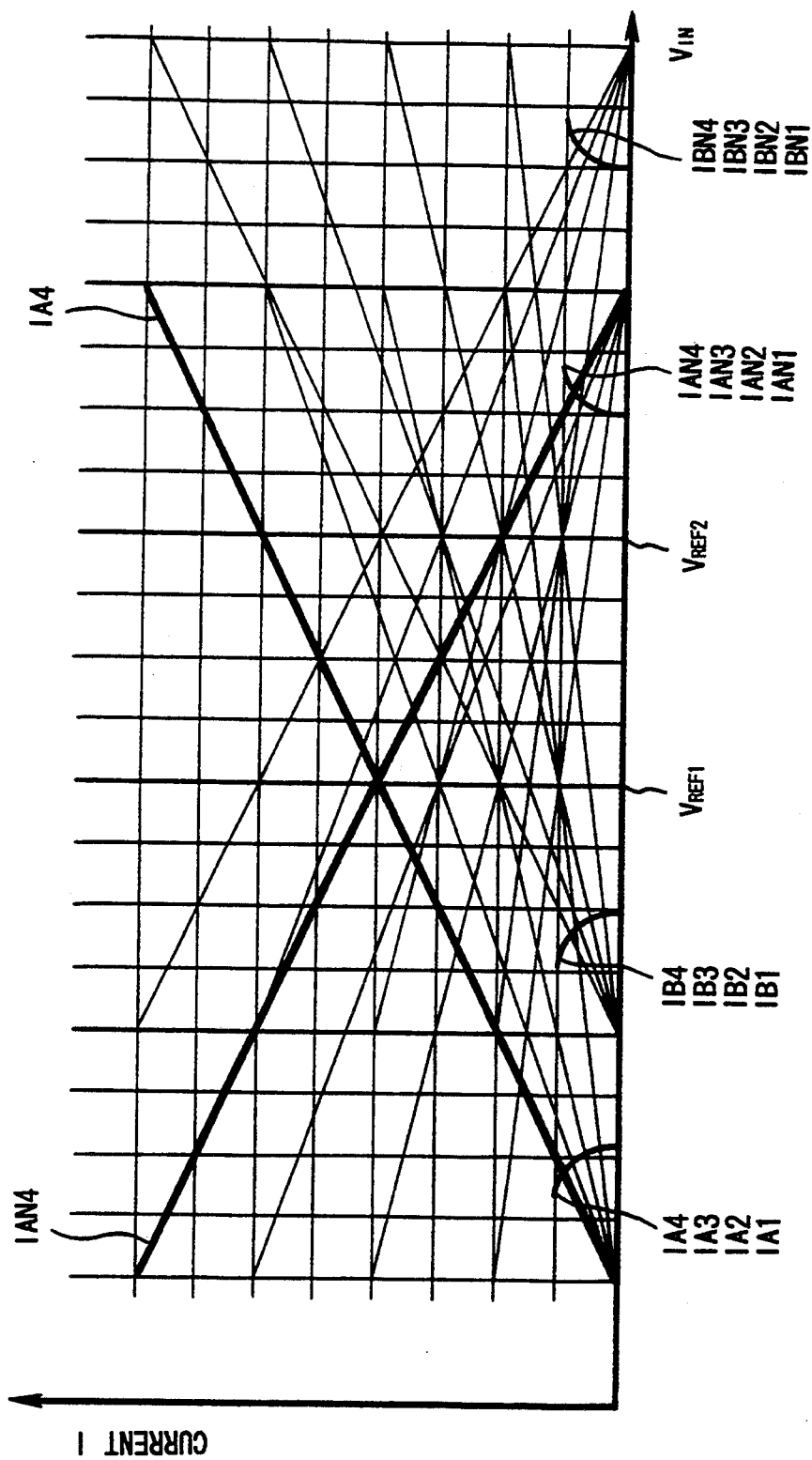
FIG. 16 is a characteristic curvilinear diagram illustrating the comparison outputs to the first reference potential according to the composition of shunt collector currents.

At this point, currents corresponding to collector currents IQ6 ($=$IA4) and IQ6N ($=$IAN4) which flow in cascade transistors Q6 and Q6N and are obtained by equations (3) and (4), flow in load resistances R1 and R5 of the differential amplifier 31 respectively (FIG. 16).

The condition where current characteristic curves of two collector currents intersect each other and voltage outputs are inverted, is realized when the analog signal $V_{IN}$ coincides with the reference electric potential $V_{REF1}$ as seen from the following equation:

$$IA4 = IAN4 \quad (7)$$

$$\frac{4I}{1+\exp\left(-\frac{V_{in}-V_{REF1}}{V_T}\right)} = \frac{4I}{1+\exp\left(\frac{V_{in}-V_{REF1}}{V_T}\right)}$$

Thus, the A-D converter 30 latches comparison outputs to the reference electric potential $V_{REF1}$ based on output voltage to be appeared in load resistances R1 and R5 at a latch circuit 36A and can deliver them.

Figure 17:
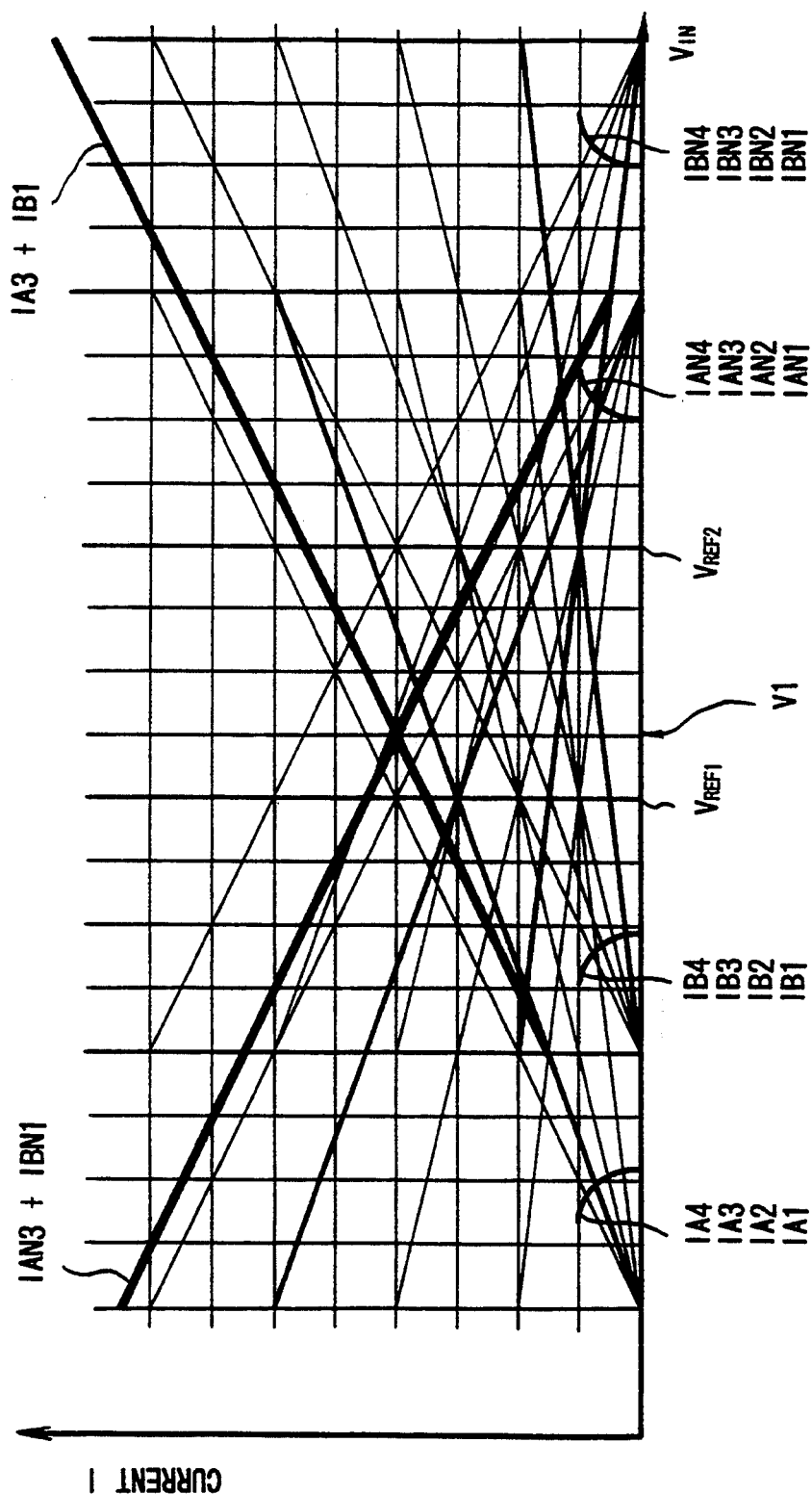
FIG. 17 is a characteristic curvilinear diagram illustrating the comparison output to the first virtual reference potential according to the composition of shunt collector currents.

Furthermore, currents corresponding to combined collector currents (IA3+IB1 and IAN3+IBN3) added collector currents IQ7 ($=$IA3) and IQ23 ($=$IB1), and IQ5N (IAN3) and IQ29N (IBN1) which are dividually flowed in cascade transistors Q7 and Q23, and Q4N and Q29N respectively, flow in load resistances R2 and R6 respectively (FIG. 17).

At this point, the condition where values of two collector currents coincide can be obtained by solving the following equation:

$$IA3 + IB1 = IAN3 + IBN1 \quad (8)$$

-continued
$$\frac{3I}{1+\exp\left(-\frac{V_{in}-V_{REF1}}{V_T}\right)} + \frac{I}{1+\exp\left(-\frac{V_{in}-(V_{REF1}+\Delta V)}{V_T}\right)} =$$

$$\frac{3I}{1+\exp\left(\frac{V_{in}-V_{REF1}}{V_T}\right)} + \frac{I}{1+\exp\left(\frac{V_{in}-(V_{REF1}+\Delta V)}{V_T}\right)}$$

Where thermal voltage $V_T$ in the equation (8) is 26 (mV) and differential voltage $\Delta V$ of adjacent two reference potentials $V_{REF1}$ and $V_{REF2}$ is 2 (mV), the input voltage $V_{IN}$ to satisfy the condition of equation (8) coincide with the value of approximately one fourth of the differential voltage $\Delta V$ as shown in the following Equation:

$$\begin{aligned} V_{in} &= V_{REF1} + 0.499908 \text{ [mV]} \\ &= V_{REF1} + \frac{0.999816}{4} \times 2 \text{ [mV]} \\ &= V_{REF1} + \frac{0.999816}{4} \times \Delta V \end{aligned} \quad (9)$$

In the case where the differential voltage $\Delta V$ is 8 (mV), 32 (mV) and 64 (mV), the values of input voltage $V_{IN}$ to satisfy the equation (8) are expressed as follows, respectively:

$$\begin{aligned} V_{in} &= V_{REF1} + 1.994091 \text{ [mV]} \\ &= V_{REF1} + \frac{0.99704}{4} \times 8 \text{ [mV]} \\ &= V_{REF1} + \frac{0.99704}{4} \times \Delta V \end{aligned} \quad (10)$$

$$\begin{aligned} V_{in} &= V_{REF1} + 7.630705 \text{ [mV]} \\ &= V_{REF1} + \frac{0.95384}{4} \times 32 \text{ [mV]} \\ &= V_{REF1} + \frac{0.95384}{4} \times \Delta V \end{aligned} \quad (11)$$

$$\begin{aligned} V_{in} &= V_{REF1} + 13.298255 \text{ [mV]} \\ &= V_{REF1} + \frac{0.83114}{4} \times 64 \text{ [mV]} \\ &= V_{REF1} + \frac{0.83114}{4} \times \Delta V \end{aligned} \quad (12)$$

Thus, the A-D converter 30 can latch comparison outputs of the input voltage $V_{IN}$ to the virtual reference potential V1 which is shifted toward the succeeding reference potential $V_{REF2}$ for one fourth of differential voltage $\Delta V$ from the reference potential $V_{REF1}$, at the latch circuit 36B based on output voltage to be appeared in load resistances R2 and R6 and can deliver them.

Figure 18:
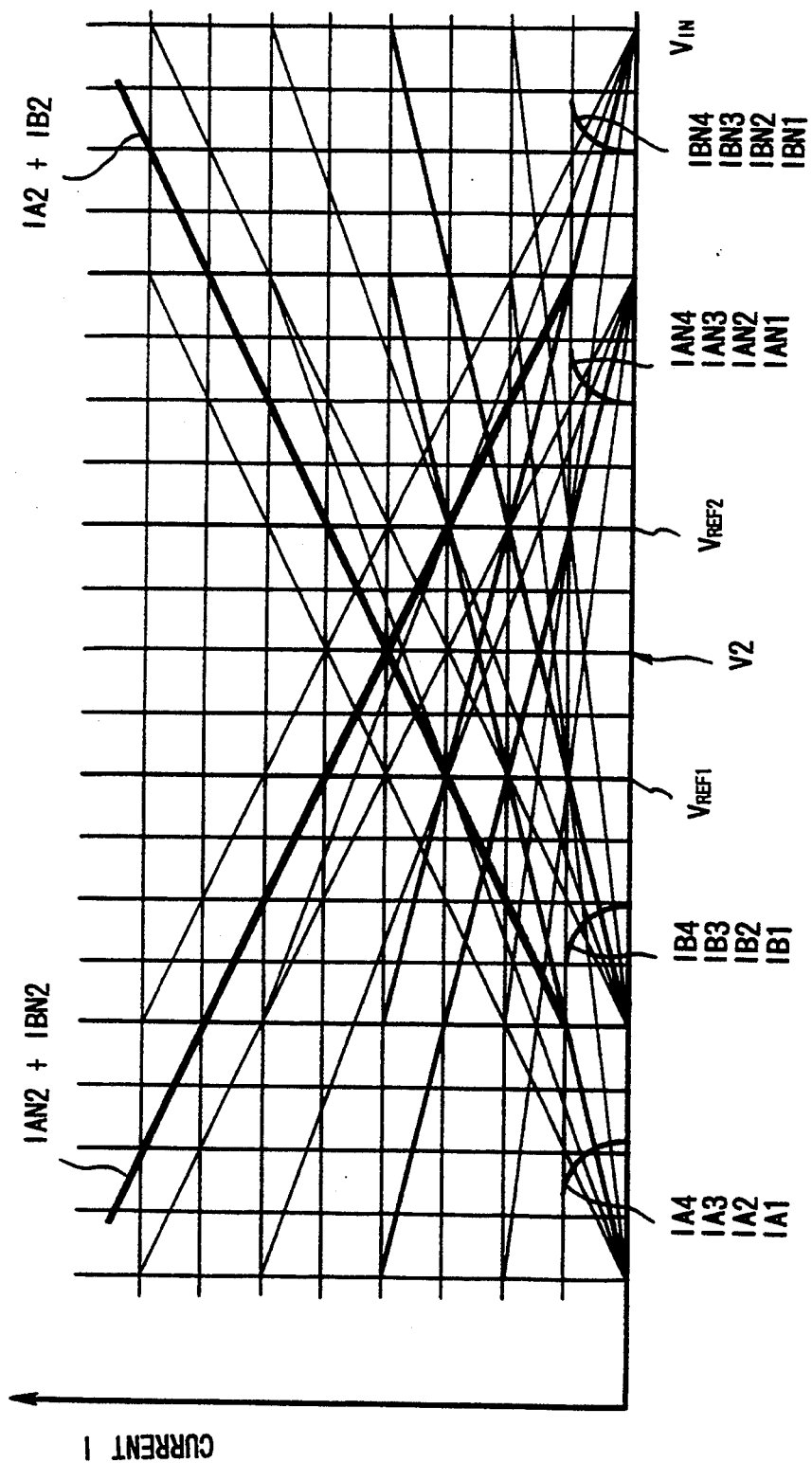
FIG. 18 is a characteristic curvilinear diagram illustrating the comparison output to the second virtual reference potential according to the composition of shunt collector currents.

Similarly, currents corresponding to combined collector currents (IA2+IB2 and IAN2+IBN2) added collector currents IQ8 ($=$IA2) and IQ24 ($=$IB2), and IQ4N ($=$IAN2) and IQ28N ($=$IBN2) which are dividually flowed in cascade transistors Q8 and Q24, and Q4N and Q28N respectively, flow in load resistances R3 and R7 respectively (FIG. 18).

In like manner, values where two collector currents coincide, can be obtained by solving the following equation:

$$IA2 + IB2 = IAN2 + IBN2 \quad (13)$$

$$\frac{2I}{1 + \exp\left(-\frac{V_{in} - V_{REF1}}{V_T}\right)} +$$

$$\frac{2I}{1 + \exp\left(-\frac{V_{in} - (V_{REF1} + \Delta V)}{V_T}\right)} =$$

$$\frac{2I}{1 + \exp\left(\frac{V_{in} - V_{REF1}}{V_T}\right)} +$$

$$\frac{2I}{1 + \exp\left(\frac{V_{in} - (V_{REF1} + \Delta V)}{V_T}\right)}$$

At this point, values of two combined collector currents (IA2+IB2 and IAN2+IBN2) coincide when it becomes the medium value $(V_{REF1}+\Delta V/2)$ of two reference potentials $V_{REF1}$ and $V_{REF2}$, regardless of a value of thermal voltage $V_T$ and a value of differential voltage $\Delta V$ between two adjacent reference potentials $V_{REF1}$ and $V_{REF2}$.

Thus, the A-D converter 30 can latch the comparison outputs of the input voltage $V_{IN}$ to the virtual reference potential V2 which is shifted toward the succeeding reference potential $V_{REF2}$ for one half of differential voltage $\Delta V$ from the reference potential $V_{REF1}$, at the latch circuit 36C based on output voltage to be appeared in load resistances R3 and R7 can deliver them.

Figure 19:
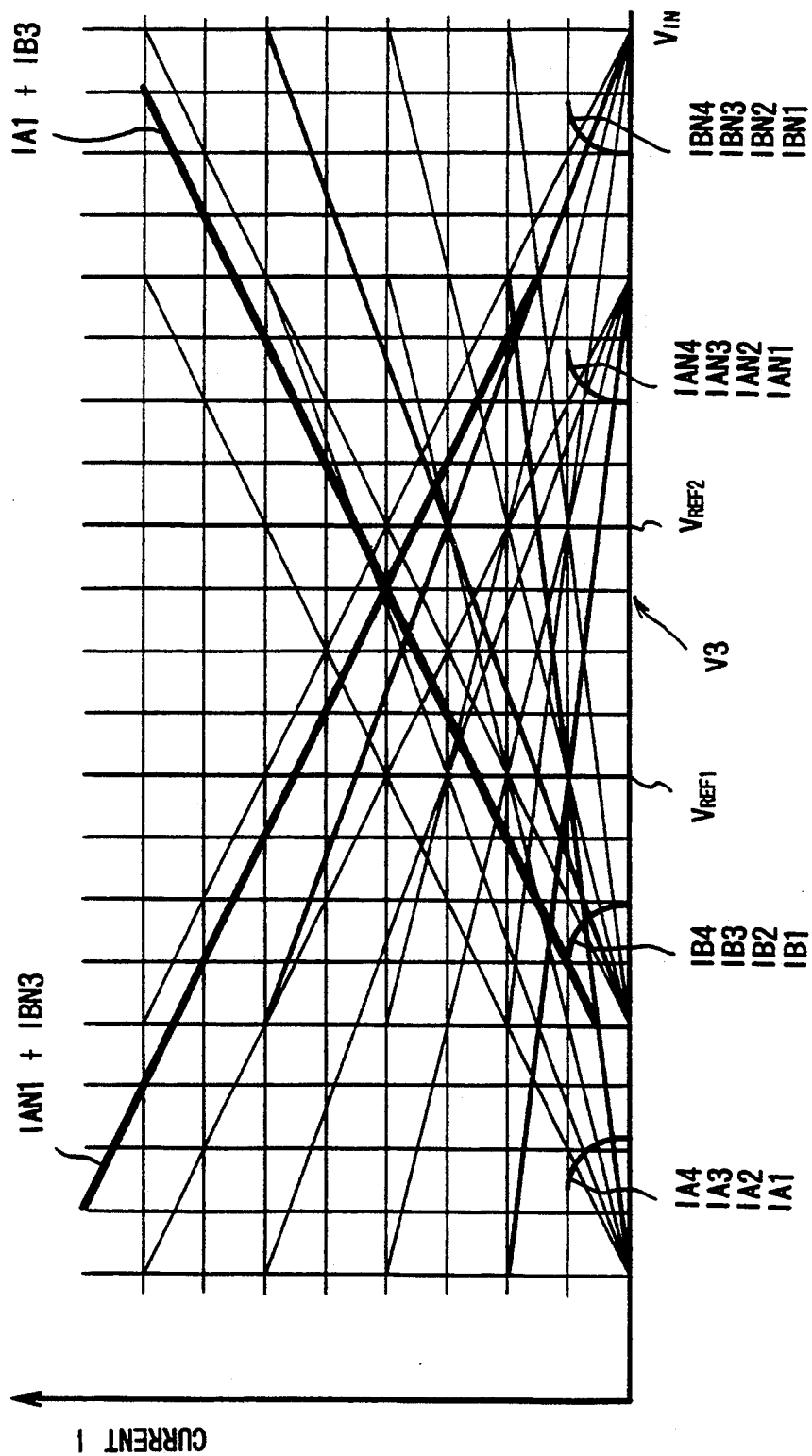
FIG. 19 is a characteristic curvilinear diagram illustrating the comparison output to the third virtual reference potential according to the composition of shunt collector currents.

In like manner, currents corresponding to combined collector currents (IA1+IB3 and IAN1+IBN3) added collector currents IQ9 (=IA1) and IQ25 (=IB3), and IQ3N (=IAN1) and IQ27N (=IBN3) which are dividually flowed in cascade transistors Q9 and Q25, and Q3N and Q27, respectively, flow in load resistances R4 and R8 respectively (FIG. 19).

At this point, values where two collector currents coincide, can be obtained by solving the following equation:

$$IA1 + IB3 = IAN1 + IBN3 \quad (14)$$

$$\frac{I}{1 + \exp\left(-\frac{V_{in} - V_{REF1}}{V_T}\right)} +$$

$$\frac{3I}{1 + \exp\left(-\frac{V_{in} - (V_{REF1} + \Delta V)}{V_T}\right)} =$$

$$\frac{I}{1 + \exp\left(\frac{V_{in} - V_{REF1}}{V_T}\right)} +$$

$$\frac{3I}{1 + \exp\left(\frac{V_{in} - (V_{REF1} + \Delta V)}{V_T}\right)}$$

Here, where thermal voltage $V_T$ in the equation (14) is 26 (mV) and differential voltage $\Delta V$ of adjacent two reference potentials $V_{REF1}$ and $V_{REF2}$ is 2 (mV), the input voltage $V_{IN}$ to satisfy the equation (14) coincides with the value of approximately three fourth of the differential voltage $\Delta V$ as shown in the following equation:

$$\begin{aligned} V_{in} &= V_{REF1} + 1.500093 \text{ [mV]} \quad (15) \\ &= V_{REF1} + \frac{3.000186}{4} \times 2 \text{ [mV]} \\ &= V_{REF1} + \frac{3.000186}{4} \times \Delta V \end{aligned}$$

In this connection, in the case where differential voltage $\Delta V$ is 8 (mV), 32 (mV), 64 (mV), the value of input voltage $V_{IN}$ to satisfy the equation (14) are obtained by the following equation, respectively:

$$\begin{aligned} V_{in} &= V_{REF1} + 6.005909 \text{ [mV]} \quad (16) \\ &= V_{REF1} + \frac{3.00295}{4} \times 8 \text{ [mV]} \\ &= V_{REF1} + \frac{3.00295}{4} \times \Delta V \end{aligned}$$

$$\begin{aligned} V_{in} &= V_{REF1} + 24.369295 \text{ [mV]} \quad (17) \\ &= V_{REF1} + \frac{3.04616}{4} \times 32 \text{ [mV]} \\ &= V_{REF1} + \frac{3.04616}{4} \times \Delta V \end{aligned}$$

$$\begin{aligned} V_{in} &= V_{REF1} + 50.701745 \text{ [mV]} \quad (18) \\ &= V_{REF1} + \frac{3.16885}{4} \times 64 \text{ [mV]} \\ &= V_{REF1} + \frac{3.16885}{4} \times \Delta V \end{aligned}$$

Thus, the A-D converter 30 can latch comparison outputs of the input voltage $V_{IN}$ to the virtual reference potential V1 which is shifted toward the following reference potential $V_{REF2}$ for three fourth of the differential voltage $\Delta V$ from the reference potential $V_{REF1}$, at the latch circuit 36D based on the output voltage to be appeared in load resistances R4 and R8 and can deliver them.

Figure 20:
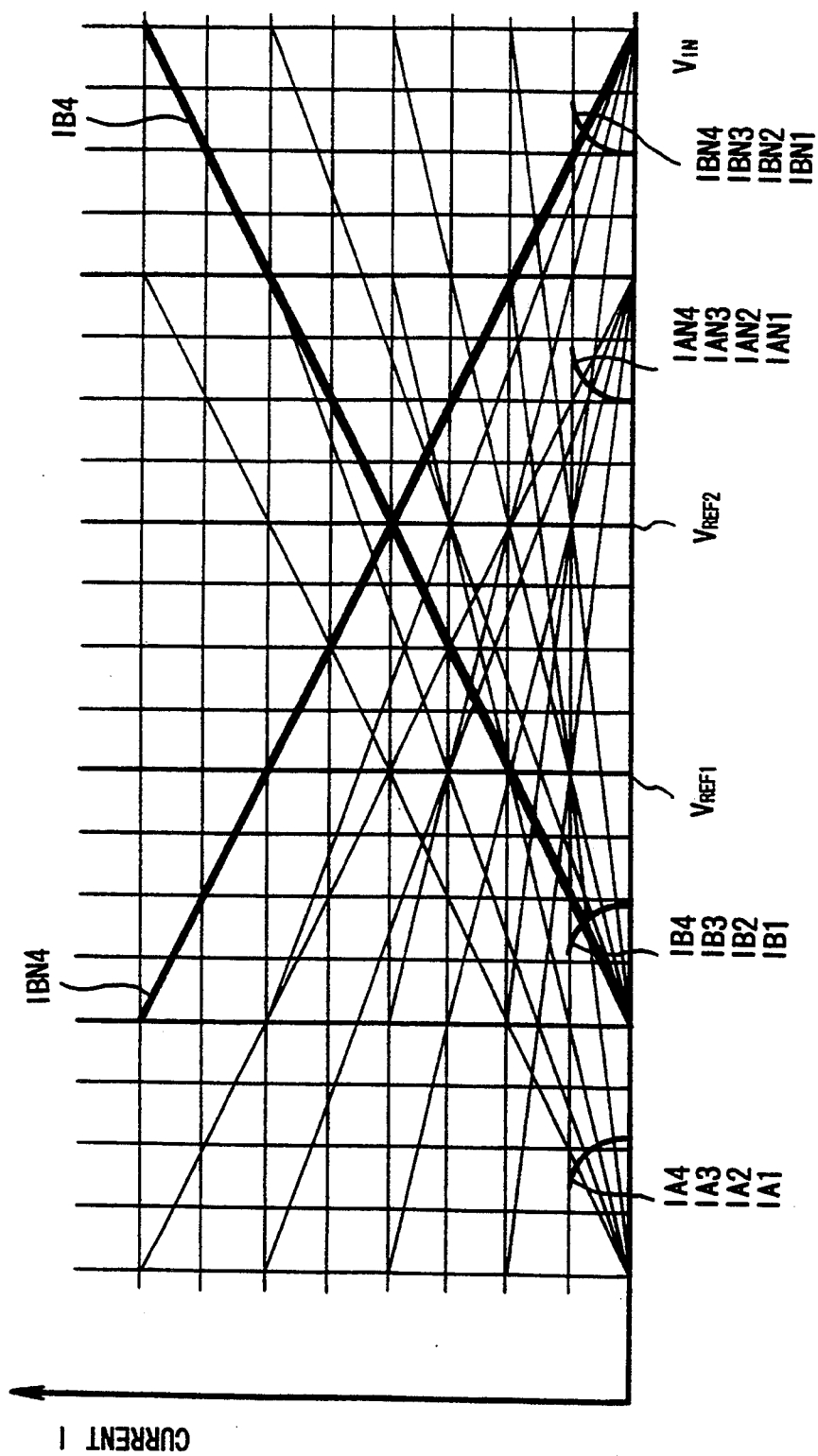
FIG. 20 is a characteristic curvilinear diagram illustrating the comparison output to the second reference potential according to the composition of shunt collector currents.

Furthermore, in the adjacent differential amplifier 32, as compared with the differential amplifier 30, since currents corresponding to collector current IQ6 (=IA4) and IQ6N (=IQN4) which flow in said cascade transistors Q26 and Q26N and to be given by the equations (3) and (4) flow in load resistances R21 and R25 respectively (FIG. 16), the input voltage where values of two collector currents coincide (FIG. 20) can be obtained when the input analog signal $V_{IN}$ coincides with the reference potential $V_{REF2}$ (=$V_{REF1}+\Delta V$) as shown in the following equation:

$$IB4 = IBN4 \quad (19)$$

$$\frac{4I}{1 + \exp\left(-\frac{V_{in} - V_{REF2}}{V_T}\right)} = \frac{4I}{1 + \exp\left(\frac{V_{in} - V_{REF2}}{V_T}\right)}$$

Accordingly, the A-D converter 30 can latch comparison outputs to the reference electric potential $V_{REF2}$ based on the output voltage to be appeared in load resistances R21 and R25 and can deliver them.

These are summarized in FIG. 21, and comparison outputs to the other reference electric potentials coincide with the output where existing each reference electric potential is divided equally.

Furthermore, at this point, currents having the same current value flow in each load resistance R1-R8, R21-R28, R41-R48, and since time constants are the same and signal speeds are equal, it is most suitable as the parallel type A-D converter.

In accordance with the foregoing construction, the A-D converter 30 enable to flow dividually currents by connecting a plurality of cascade transistors having different emitter areas to the differential pair; and generates virtual reference potential V2 which divides the reference potentials $V_{REF1}$ and $V_{REF2}$ into two by combining and adding currents divided, not by differential voltage $\Delta V$ between continuous reference potentials $V_{REF1}, V_{REF2}...$, and furthermore, it generates virtual reference potentials V1, V3 which divide the virtual reference potential and adjacent both reference potentials approximately into two; and the interpolation to divide the whole into four equal parts can be realized by obtaining comparison outputs of said virtual reference potentials, V1, V2, V3, and input signal $V_{IN}$ and the number of comparators at the primary stage can be decreased by one fourth.

The reduction of the number of comparators results in the decline of input capacity, and especially it is effective for the A-D converter which is required high-speed processing speed.

Furthermore, since three reference electric potentials are generated virtually by interpolation, even in the case where the reference potentials actually given deviate from the ideal value, the differential linearity errors can be reduced further and the linearity characteristic can be increased by interpolating the amount of deviation with multiple reference electric potentials.

Furthermore, the parallel type A-D converter 30 cascade connects transistors Q10-Q13, Q10N-Q13N, Q30-Q33, Q30N-Q33N ... to load resistances R1-R8, R21-R28 ..., and since the imaginary collector capacities of cascade transistors Q3-Q9, Q3N-Q9N, Q23-Q29, Q23N-Q39N ... to be used for dividing currents can be minimized, the time constant can be minimized and the processing speed can be further improved.

Figure 22:
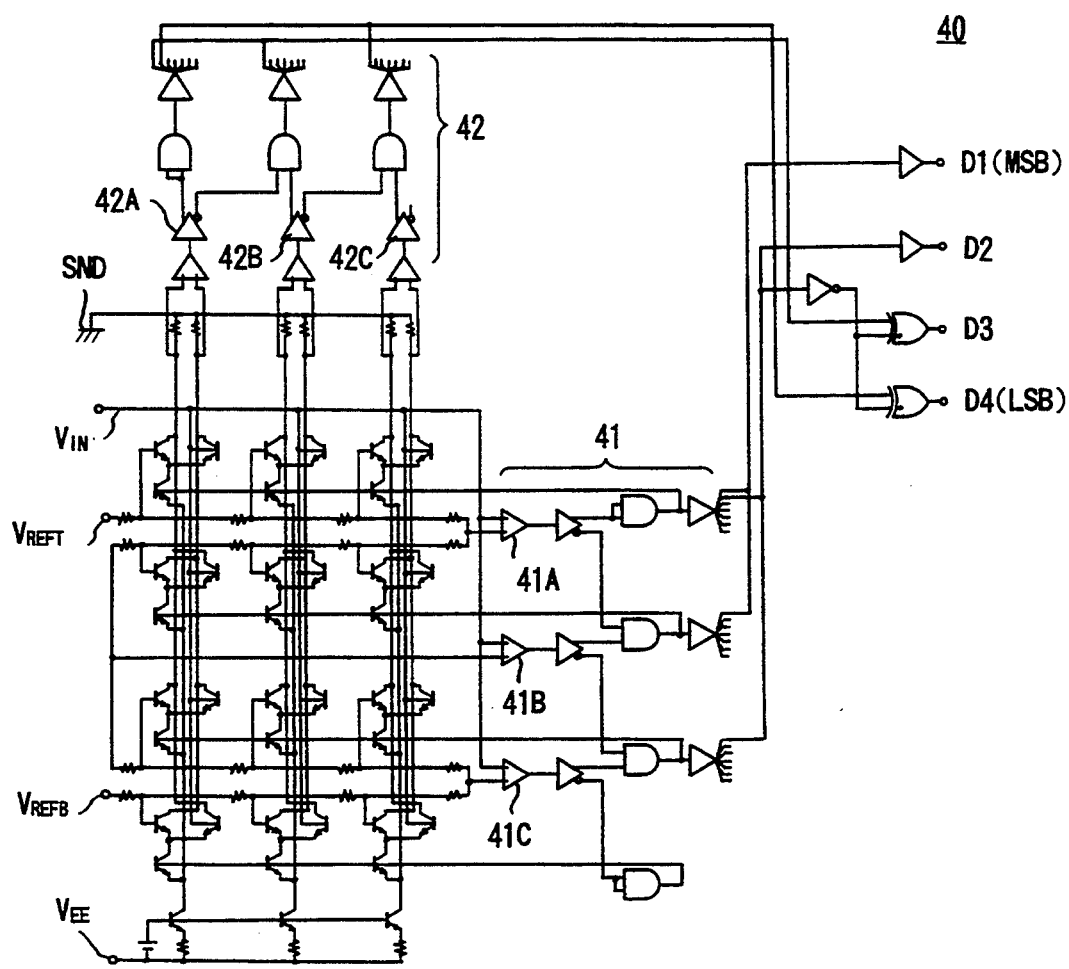
FIG. 22 is a connection diagram illustrating the series-parallel A/D converter according to the other embodiment.

Next, the other embodiments in this invention will be described with reference to the accompanying drawings:

The embodiments described above have dealt with the case of primary stage of comparators in the parallel type A-D converter. However, the present invention is not only limited to the above but also suitably applied to the lower stage of comparators in the series-parallel type (subranging type) A-D converter as shown in FIG. 22.

Here, a series-parallel A-D converter 40 having 4-bit (2-bit+2-bit) resolving power comprises an upper rank bit comparison unit 41 which converts and outputs the upper rank bits D1 and D2 by comparing the input signal $V_{IN}$ and the prescribed reference potential sequentially, and a lower rank bit comparison unit 42 which converts and outputs the lower rank bits D3 and D4.

In this case, since the input stage of lower rank comparison unit 42 comprises three comparators 42A, 42B and 42C composed of differential amplifiers, said comparators 42A-42C may compare, in the same manner as the embodiments, voltages to be generated in the load resistances by interpolation process for dividing collector currents and adding said dividual collector currents by cascade transistors.

Thus, the number of comparators can be decreased and the differential linearity characteristic can be increased by interpolation process even though the number of bits increases.

Furthermore, the embodiment described above has dealt with the case of dividing the reference electric potential into four parts. The present invention is not, however, only limited to the above but it may also be used in the case of dividing into two and also widely applicable to the case of dividing by other dividing ratios.

Moreover, the embodiment described above has dealt with the case of cascade connecting transistors Q10-Q13, Q10N-Q13N, Q30-Q33, Q30N-Q33N ... in order to minimize the collector capacity between cascade transistors to divide collector currents and load resistances. However, the present invention is not only limited to the above but in the case where the low speed driving is acceptable, these transistors may not be cascade connected.

Furthermore, the embodiment described above has dealt with the case of cascade connecting a plurality of transistors with different ratios of emitter areas to a pair of transistors Q1 and Q2, Q21 and Q22 ... composing differential pair directly and dividing collector current. However, the present invention is not only limited to the above, but emitter resistance may be added to the emitters of transistors for dividing in order to minimize the amount of scatter in current ratios.

Moreover, the embodiment described above has dealt with the case of selecting the ratios of emitter areas of multiple cascade transistors for dividing collector currents, Q3, Q4, Q5, Q6, Q7, Q8, Q9 (Q3N, Q4N, Q5N, Q6N, Q7N, Q8N, Q9N) in the ratios 1:2:3:4:3:2:1. However, the present invention is not only limited to the above, but it may select in the other ratios.

Furthermore, the embodiment described above has dealt with the case of utilizing in the parallel A-D converter. However, the present invention is not only limited to the above, but also widely applicable to the comparison unit of analog signal.

According to the present invention as discussed above, the number of comparison means can be decreased compared with the necessary number of reference values and by decreasing the number of elements an analog signal comparison circuit with small input capacity and having small differential linearity errors can be obtained by combining and adding the first and second inversion output currents corresponding to the first and second reference values of input analog signals, a plurality of first and second shunt inversion output currents divided the first and second non-inversion output currents, and the first and second dividual non-inversion output currents, and outputting the comparison outputs corresponding to the virtual reference values for dividing the first reference value, and the first reference value, and the second reference value, equally.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An analog signal comparison circuit comprising:
   a first differential input stage for inputting a first reference value to one side of input terminal and for inputting an input analog signal to the other side of input terminal, and outputting the first inversion output current and non-inversion output current depending upon said input analog signal;
   a second differential input stage for inputting a second reference value to one side of input terminal and for inputting said analog signal to the other side of input terminal, and for outputting the second inversion output current and non-inversion output current depending upon said input analog signal;
   a current dividing means for dividing said first and second inversion output currents and the first and second non-inversion output currents to a plurality of currents and for outputting as the first and second shunt inversion output currents and the first and second dividual non-inversion output currents; and
   a current composing means for forming a plurality of composite inversion output currents upon adding said first and second inversion output currents respectively, and simultaneously forming multiple composite non-inversion output currents upon adding said first and second non-inversion output currents respectively, and outputting comparison outputs corresponding to said first reference value of said input analog signal and comparison outputs corresponding to virtual reference values which divided said first and second reference values equally depending upon said composite inversion output currents and composite non-inversion output currents.

2. An analog signal comparison circuit according to claim 1, wherein:
   said current dividing means divides said first and second inversion output currents and said first and second non-inversion output currents into multiple currents by cascade connecting a plurality of transistors to collectors of a pair of transistors comprising said first and second differential input stages respectively.

3. An analog signal comparison circuit according to claim 1, wherein:
   said current dividing means connects load resistances to collectors of a plurality of transistors to be cascade connected to collectors of a pair of transistors comprising said first and second differential input stages.

4. An analog signal comparison circuit according to claim 1, wherein:
   said current composing means supplies said composite inversion output current and said composite non-inversion output current to load resistances through transistors to be cascade connected to said current dividing means and outputs comparison outputs corresponding to said first reference value of said input analog signal and comparison outputs corresponding to the virtual reference value to divide said first and second reference values equally.

5. An analog signal comparison circuit according to claim 1, wherein:
   said current composing means selectively connects each current value of a plurality of said composite inversion output currents and a plurality of said composite non-inversion output currents and outputs currents of the same value.

* * * * *